US012656622B2

(12) United States Patent
Ko et al.

(10) Patent No.: US 12,656,622 B2
(45) Date of Patent: Jun. 16, 2026

(54) ELECTRONIC DEVICE

(71) Applicant: Samsung Display Co., Ltd., Yongin-si (KR)

(72) Inventors: Moosoon Ko, Seoul (KR); Sanghoon Yim, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 824 days.

(21) Appl. No.: 17/404,485

(22) Filed: Aug. 17, 2021

(65) Prior Publication Data

US 2022/0059806 A1     Feb. 24, 2022

(30) Foreign Application Priority Data

Aug. 19, 2020     (KR) ......................... 10-2020-0104174

(51) Int. Cl.
| | |
|---|---|
| *G02B 27/28* | (2006.01) |
| *H10K 59/38* | (2023.01) |
| *H10K 59/80* | (2023.01) |
| *H04N 23/57* | (2023.01) |
| *H10K 59/126* | (2023.01) |

(52) U.S. Cl.
CPC ........... *G02B 27/286* (2013.01); *H10K 59/38* (2023.02); *H10K 59/8792* (2023.02); *H04N 23/57* (2023.01); *H10K 59/126* (2023.02); *H10K 59/87* (2023.02)

(58) Field of Classification Search
None
See application file for complete search history.

(56) References Cited

U.S. PATENT DOCUMENTS

| | | | |
|---|---|---|---|
| 9,143,668 B2 | 9/2015 | Mathew et al. | |
| 9,224,973 B2 | 12/2015 | Park et al. | |
| (Continued) | | | |

FOREIGN PATENT DOCUMENTS

| | | |
|---|---|---|
| CN | 103871327 A | 6/2014 |
| CN | 105891932 A | 8/2016 |
| (Continued) | | |

OTHER PUBLICATIONS

Translation of CN 111682048 B (Year: 2023).*

(Continued)

*Primary Examiner* — Sue A Purvis
*Assistant Examiner* — Carnell Hunter, III
(74) *Attorney, Agent, or Firm* — F. CHAU & ASSOCIATES, LLC

(57) ABSTRACT

An electronic device includes an electronic module, a support member including a through-hole overlapping the electronic module, a display panel disposed on the support member and including a first display region overlapping the through-hole of the support member, and a second display region that does not overlap the through-hole of the support member, the second region being adjacent to the first display region, a light control layer disposed on the display panel, and a lower polarizing plate disposed between the electronic module and the display panel, wherein the lower polarizing plate includes a first linear polarizing layer adjacent to the electronic module, and a first phase retardation layer disposed between the first linear polarizing layer and the display panel.

32 Claims, 30 Drawing Sheets

(56)        References Cited

U.S. PATENT DOCUMENTS

| | | | | |
|---|---|---|---|---|
| 9,257,563 | B2 | 2/2016 | Ahn et al. | |
| 9,709,844 | B2 | 7/2017 | Yim et al. | |
| 10,401,675 | B2 | 9/2019 | Lee et al. | |
| 2013/0314647 | A1* | 11/2013 | Yim | H10K 59/50 |
| | | | | 445/24 |
| 2015/0153495 | A1 | 6/2015 | Matsuda et al. | |
| 2015/0219950 | A1 | 8/2015 | Kim et al. | |
| 2015/0378078 | A1 | 12/2015 | Jiao et al. | |
| 2016/0238770 | A1* | 8/2016 | Goto | G02B 5/3033 |
| 2017/0123120 | A1* | 5/2017 | Shirouchi | G02B 5/201 |
| 2017/0131593 | A1* | 5/2017 | Tang | G02B 6/0055 |
| 2017/0261793 | A1* | 9/2017 | Son | G02F 1/133553 |
| 2019/0086729 | A1* | 3/2019 | Saito | G02F 1/13362 |
| 2019/0091970 | A1* | 3/2019 | Ueki | B32B 37/12 |
| 2020/0075680 | A1* | 3/2020 | Sun | H10K 59/121 |
| 2020/0117034 | A1 | 4/2020 | Yin et al. | |
| 2021/0191193 | A1 | 6/2021 | Liu et al. | |
| 2021/0376292 | A1 | 12/2021 | Choi et al. | |

FOREIGN PATENT DOCUMENTS

| | | | | | |
|---|---|---|---|---|---|
| CN | 107179624 | A | 9/2017 | | |
| CN | 108122488 | A | 6/2018 | | |
| CN | 108269840 | | 7/2018 | | |
| CN | 109001935 | A | 12/2018 | | |
| CN | 109192759 | A | 1/2019 | | |
| CN | 108074533 | | 12/2019 | | |
| CN | 111292628 | A | 6/2020 | | |
| CN | 111682048 | B * | 10/2023 | ......... | H01L 27/3218 |
| EP | 1 118 885 | | 7/2001 | | |
| JP | 2012-098726 | A2 | 5/2012 | | |
| KR | 10-2016-0034620 | | 3/2016 | | |
| KR | 10-2031816 | | 10/2019 | | |
| KR | 10-2020-0002968 | | 1/2020 | | |
| KR | 10-2080007 | | 2/2020 | | |
| KR | 10-2021-0149964 | | 12/2021 | | |
| WO | 2020/062413 | | 4/2020 | | |
| WO | WO-2020062413 | A1 * | 4/2020 | ......... | G02F 1/13312 |

OTHER PUBLICATIONS

Partial European search report for European Patent Application or Patent No. 21190832.2 dated Jan. 26, 2022.

Extended European Search Report for European Patent Application or Patent No. 21190832.2 dated Jun. 10, 2022.

* cited by examiner

DP

BB'

NSA-EP
SA-EP ⎫ AA

NAA

DL1

GDC

AA'

SGL

DL  CSL  GL  PWL

PX

DR2

DR1

ELECTRONIC DEVICE

CROSS-REFERENCE TO RELATED APPLICATION(S)

This application claims priority to and benefits of Korean Patent Application No. 10-2020-0104174 under 35 U.S.C. § 119, filed on Aug. 19, 2020 in the Korean Intellectual Property Office, the entire contents of which are incorporated herein by reference.

BACKGROUND

1. Technical Field

The disclosure herein relates to a display device, and, to an electronic device including an electronic module.

2. Description of the Related Art

Various types of display devices are used to provide image information, and such display devices may include an electronic module for receiving an external signal or externally providing an output signal. For example, the electronic module may include a camera module or the like, and there is an increasing demand for display devices capable of obtaining high-quality captured images.

In order to increase an image display area in a display device, consideration is given to the arranging or disposing of a camera module or the like in the image display area. The improvement of the quality of a captured image is a function of such an arrangement.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides an electronic device with reduced distortion of an optical signal that is incident onto an electronic module arranged or disposed under or below a display panel or is emitted from the electronic module.

The disclosure also provides an electronic device enabling improvement of the quality of an image which is captured using a camera module arranged or disposed under or below a display panel.

An embodiment provides an electronic device that may include an electronic module; a support member in which a through-hole overlapping the electronic module is defined; a display panel disposed on the support member and including a first display region overlapping the through-hole of the support member; and a second display region that does not overlap the through-hole of the support member, the second display region being adjacent to the first display region; a light control layer disposed on the display panel; and a lower polarizing plate disposed between the electronic module and the display panel, wherein the lower polarizing plate may include a first linear polarizing layer adjacent to the electronic module; and a first phase retardation layer disposed between the first linear polarizing layer and the display panel.

In an embodiment, the first phase retardation layer the lower polarizing plate may be a $\lambda/4$ phase retarder, and an angle between an absorption axis of the first linear polarizing layer the lower polarizing plate and an optical axis of the first phase retardation layer the lower polarizing plate may be about 45±5 degrees.

In an embodiment, the light control layer may include an upper polarizing plate, the upper polarizing plate may include a second linear polarizing layer; and a second phase retardation layer disposed between the display panel and the second linear polarizing layer, the second phase retardation layer of the upper polarizing plate may be a $\lambda/4$ phase retarder, and an angle between an absorption axis of the second linear polarizing layer of the upper polarizing plate and an optical axis of the second phase retardation layer of the upper polarizing plate may be about 45±5 degrees.

In an embodiment, the first phase retardation layer of the lower polarizing plate may include a first $\lambda/4$ phase retarder; and a first $\lambda/2$ phase retarder disposed between the first $\lambda/4$ phase retarder and the first linear polarizing layer of the lower polarizing plate, an angle between an absorption axis of the first linear polarizing layer of the lower polarizing plate and an optical axis of the first $\lambda/4$ phase retarder may be about 15±5 degrees, and an angle between the absorption axis of the first linear polarizing layer of the lower polarizing plate and an optical axis of the first $\lambda/2$ phase retarder may be about 75±5 degrees.

In an embodiment, the light control layer may include an upper polarizing plate, the upper polarizing plate may include a second linear polarizing layer; a second $\lambda/4$ phase retarder disposed between the display panel and the second linear polarizing layer; and a second $\lambda/2$ phase retarder disposed between the second $\lambda/4$ phase retarder and the second linear polarizing layer, an angle between an absorption axis of the second linear polarizing layer of the upper polarizing plate and an optical axis of the second $\lambda/4$ phase retarder of the upper polarizing plate may be about 15±5 degrees, and an angle between the absorption axis of the second linear polarizing layer of the upper polarizing plate and an optical axis of the second $\lambda/2$ phase retarder of the upper polarizing plate may be about 75±5 degrees.

In an embodiment, a polarized component transmitted through the lower polarizing plate and a polarized component transmitted through the light control layer may be both counterclockwise polarized light.

In an embodiment, a polarized component transmitted through the lower polarizing plate and a polarized component transmitted through the light control layer may be both clockwise polarized light.

In an embodiment, the light control layer may include a first filter portion that transmits blue light; a second filter portion that transmits green light; a third filter portion that transmits red light; and a light-shielding portion overlapping edges of the first filter portion, the second filter portion, and the third filter portion.

In an embodiment, the lower polarizing plate may overlap the first display region of the display panel and a portion of the second display region of the display panel adjacent to the first display region of the display panel.

In an embodiment, the electronic device may further include an adhesive layer disposed between the support member and the display panel, wherein the adhesive layer may fill a gap between the support member and the display panel by overlapping the second display region of the display panel that does not overlap the lower polarizing plate.

In an embodiment, the electronic module may include a lens adjacent to the lower polarizing plate, and an area of the lower polarizing plate may be greater than an area of the lens of the electronic module in a plan view.

In an embodiment, the lower polarizing plate may include a first polarizing region overlapping the first display region and including a first polarizing portion; and a first non-polarizing portion having a higher light transmittance than a light transmittance of the first polarizing portion; and a second polarizing region adjacent to the first polarizing region and overlapping the second display region of the display panel.

In an embodiment, the first linear polarizing layer of the lower polarizing plate may include a stretched polymer film and light absorbers adsorbed into the stretched polymer film, and a number of light absorbers per unit area in the first non-polarizing portion of the lower polarizing plate may be smaller than a number of light absorbers per unit area in the first polarizing portion of the lower polarizing plate.

In an embodiment, the light control layer may include an upper polarizing plate, and the upper polarizing plate may include a third polarizing region overlapping the first polarizing region of the lower polarizing plate and including a second polarizing portion; and a second non-polarizing portion having a higher light transmittance than a light transmittance of the second polarizing portion; and a fourth polarizing region overlapping the second polarizing region of the lower polarizing plate.

In an embodiment, the display panel may include a base layer; a circuit layer including a shielding pattern disposed on the base layer; a light-emitting element layer disposed on the circuit layer; and an upper insulating layer disposed on the light-emitting element layer.

In an embodiment, the second display region of the display panel may include a non-pixel region not including the shielding pattern; and a pixel region including the shielding pattern, and a light transmittance of light transmitted through the light control layer and the lower polarizing plate overlapping the non-pixel region may be higher than a light transmittance of light transmitted through the light control layer and the lower polarizing plate overlapping the pixel region.

In an embodiment, the electronic module may be a camera having an optical path in a direction to the display panel.

In an embodiment, each of the first display region and the second display region of the display panel may include a plurality of pixel units, a number of pixel units per unit area of the plurality of pixel units in the second display region of the display panel may be smaller than a number of pixel units per unit area of the plurality of pixel units in the first display region of the display panel.

In an embodiment, an electronic device may include an electronic module; a display panel disposed on the electronic module and including a first display region; and a second display region having a lower pixel density than a pixel density of the first display region and overlapping the electronic module; an upper polarizing plate disposed on the display panel; and a lower polarizing plate disposed between the electronic module and the display panel, wherein the upper polarizing plate and the lower polarizing plate circularly polarize incident light in a same direction to transmit the incident light.

In an embodiment, the upper polarizing plate and the lower polarizing plate may counterclockwise polarize light to transmit the counterclockwise polarized light, or the upper polarizing plate and the lower polarizing plate may clockwise polarize light to transmit the clockwise polarized light.

In an embodiment, the lower polarizing plate may include a first linear polarizing layer; and a first $\lambda/4$ phase retarder disposed between the first linear polarizing layer and the display panel, and an angle between an absorption axis of the first linear polarizing layer and an optical axis of the first $\lambda/4$ phase retarder may be about 45±5 degrees.

In an embodiment, the upper polarizing plate may include a second linear polarizing layer; and a second $\lambda/4$ phase retarder disposed between the display panel and the second linear polarizing layer, and an angle between an absorption axis of the second linear polarizing layer and an optical axis of the second $\lambda/4$ phase retarder may be about 45±5 degrees.

In an embodiment, the lower polarizing plate may include a first linear polarizing layer; a first $\lambda/4$ phase retarder disposed on the first linear polarizing layer; and a first $\lambda/2$ phase retarder disposed between the first $\lambda/4$ phase retarder and the first linear polarizing layer, an angle between an absorption axis of the first linear polarizing layer and an optical axis of the first $\lambda/4$ phase retarder may be about 15±5 degrees, and an angle between the absorption axis of the first linear polarizing layer and an optical axis of the first $\lambda/2$ phase retarder may be about 75±5 degrees.

In an embodiment, the upper polarizing plate may include a second linear polarizing layer; a second $\lambda/4$ phase retarder disposed between the display panel and the second linear polarizing layer; and a second $\lambda/2$ phase retarder disposed between the second $\lambda/4$ phase retarder and the second linear polarizing layer, an angle between an absorption axis of the second linear polarizing layer and an optical axis of the second $\lambda/4$ phase retarder may be about 15±5 degrees, and an angle between the absorption axis of the second linear polarizing layer and an optical axis of the second $\lambda/2$ phase retarder may be about 75±5 degrees.

In an embodiment, the electronic module may include a lens adjacent to the lower polarizing plate, and an area of the lower polarizing plate may be greater than an area of the lens of the electronic module in a plan view.

In an embodiment, an electronic device may include an electronic module; a display panel disposed on the electronic module and including a first display region overlapping the electronic module; and a second display region surrounding at least a portion of the first display region; a light control layer disposed on the display panel; and a lower polarizing plate disposed between the electronic module and the display panel, wherein the lower polarizing plate may include a first linear polarizing layer adjacent to the electronic module and including a polarizing portion; and a non-polarizing portion having a higher light transmittance than a light transmittance of the polarizing portion; and a first phase retardation layer disposed between the first linear polarizing layer and the display panel.

In an embodiment, the first linear polarizing layer may include a stretched polymer film and light absorbers adsorbed into the stretched polymer film, and the non-polarizing portion of the lower polarizing plate may include the stretched polymer film in which the light absorbers may be desorbed.

In an embodiment, the lower polarizing plate may include a first polarizing region including the non-polarizing portion and overlapping the first display region of the display panel; and a second polarizing region overlapping the second display region of the display panel and not including the non-polarizing portion of the first polarizing region of the lower polarizing plate.

In an embodiment, the display panel may include a base layer; a circuit layer including a shielding pattern disposed on the base layer; a light-emitting element layer disposed on the circuit layer; and an upper insulating layer disposed on the light-emitting element layer, wherein the shielding pattern and the non-polarizing portion of the first polarizing region of the lower polarizing plate may not overlap in the first display region of the display panel.

In an embodiment, the first phase retardation layer may be a λ/4 phase retarder, and an angle between an absorption axis of the first linear polarizing layer and an optical axis of the first phase retardation layer may be about 45±5 degrees.

In an embodiment, the light control layer may include an upper polarizing plate, the upper polarizing plate may include a second linear polarizing layer; and a second phase retardation layer disposed between the display panel and the second linear polarizing layer, the second phase retardation layer may be a λ/4 phase retarder, and an angle between an absorption axis of the second linear polarizing layer and an optical axis of the second phase retardation layer may be about 45±5 degrees.

In an embodiment, the upper polarizing plate may include a third polarizing region overlapping the first polarizing region of the lower polarizing plate and including a second polarizing portion; and a second non-polarizing portion having a higher light transmittance than a light transmittance of the second polarizing portion; and a fourth polarizing region overlapping the second polarizing region of the lower polarizing plate and not including the second non-polarizing portion.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1:
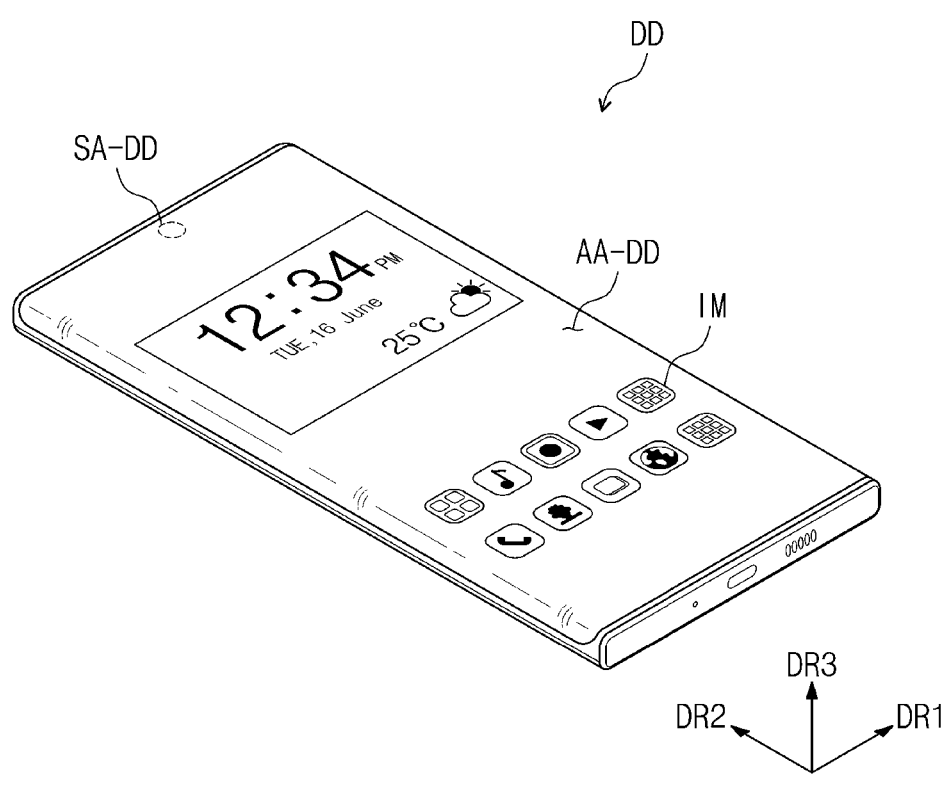
FIG. 1 is a perspective view illustrating an electronic device of an embodiment.

The disclosure may be variously modified and may include various modes. However, embodiments are illustrated in the drawings and are described in detail below. However, it should be understood that the disclosure is not limited to specific forms, but rather is intended to cover all modifications, equivalents or alternatives that fall within the spirit and scope of the disclosure.

It will be understood that when an element (or a region, layer, portion, or the like) is referred to as being "on", "connected to", or "coupled to" another element, it can be directly on or directly connected/coupled to the other element, or a third element or other elements may be present therebetween.

The term "directly arranged or disposed" used herein may indicate that there is no additional layer, film, region, plate, or the like between a portion such as a layer, film, region, plate, or the like and another portion. For example, the term "directly arranged or disposed" may indicate that two layers or two members are arranged or disposed without an additional member such as an adhesive or the like therebetween.

The same reference numerals refer to the same elements. In the drawings, the thicknesses, ratios, and dimensions of elements are exaggerated for clarity of illustration.

As used herein, the term "and/or" includes any combinations that can be defined by associated elements.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "first", "second" and the like may be used for describing various elements, but the elements should not be construed as being limited by these terms. Such terms are only used for distinguishing one element from another element or from other elements. For example, a first element could be termed a second element and vice versa without departing from the teachings of the disclosure. The terms of a singular form may include plural forms unless otherwise specified.

Furthermore, the terms "under", "lower side", "on", "upper side", and the like are used to describe association relationships among elements illustrated in the drawings. The terms, which are relative concepts, are used on the basis of directions illustrated in the drawings. The term "arranged or disposed on" used herein may indicate that a certain element may be arranged or disposed not only on a certain member but also under or below the certain member.

Additionally, the spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

All of the terms used herein (including technical and scientific terms) have the same meanings as understood by those skilled in the art, unless otherwise defined. Terms in common usage such as those defined in commonly used dictionaries should be interpreted to contextually match the meanings used in the relevant art, and are interpreted to be explicitly defined herein unless interpreted in an idealized or overly formal sense.

It will be further understood that the terms "include", "including", "has", "having", and the like, when used in this specification, specify the presence of stated features, numbers, steps, operations, elements, components, or combinations thereof, but do not preclude the presence or addition of one or more other features, numbers, steps, operations, elements, components, or combinations thereof.

Hereinafter, an electronic device according to an embodiment will be described with reference to the accompanying drawings.

Figure 2:
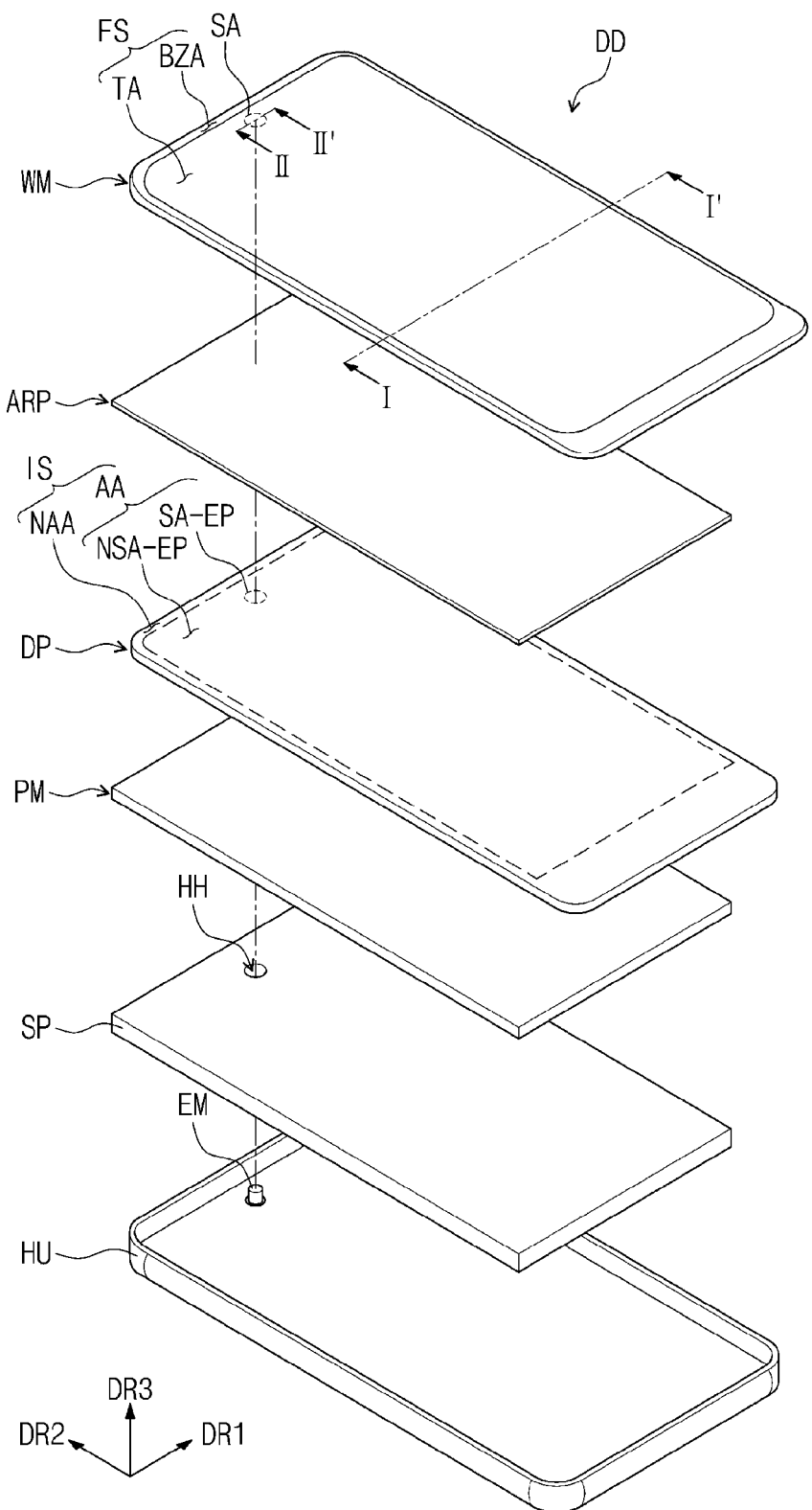
FIG. 2 is an exploded perspective view of an electronic device according to an embodiment.
Figure 3:
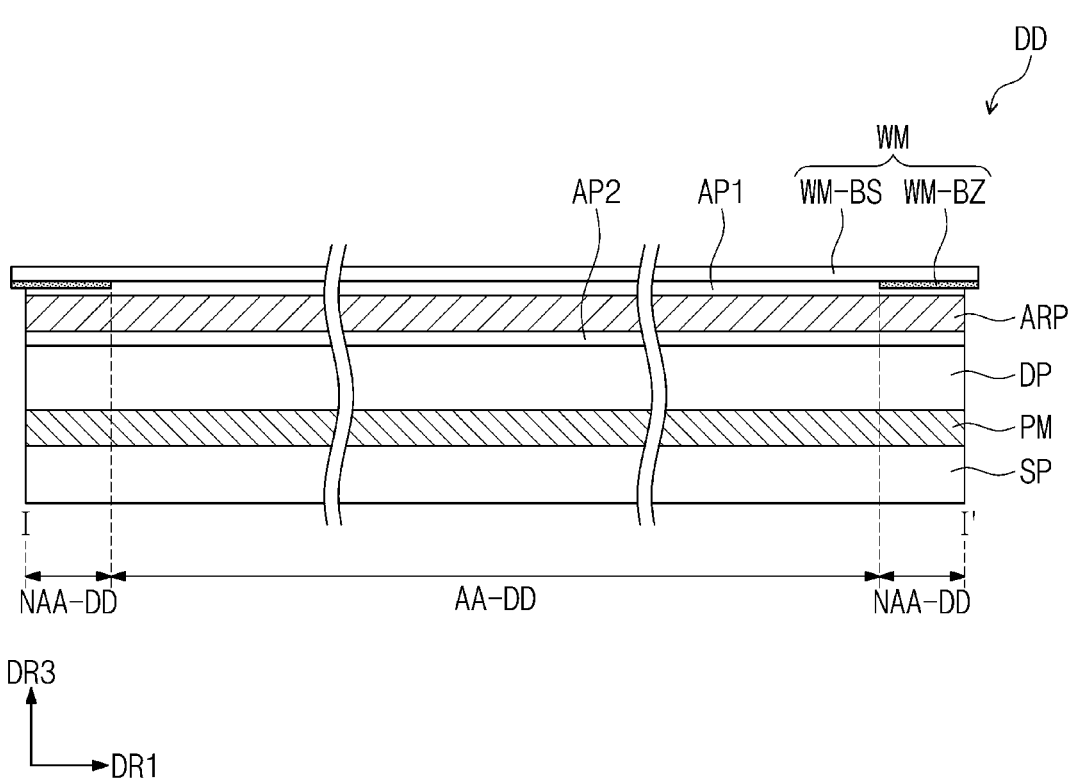
FIG. 3 is a schematic cross-sectional view of an electronic device taken along line I-I' of FIG. 2 of an embodiment.
Figure 4:
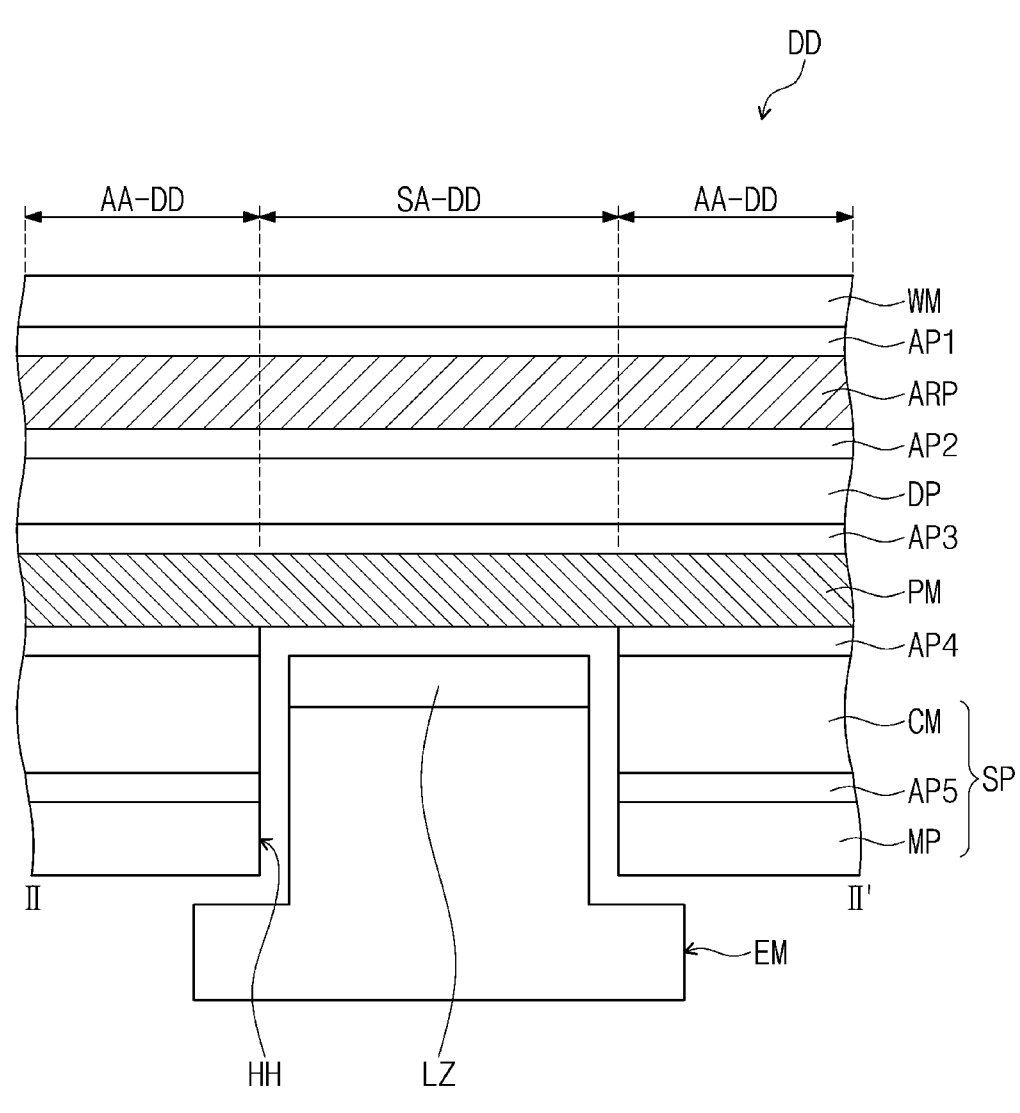
FIG. 4 is a schematic cross-sectional view of a portion of an electronic device taken along line II-II' of FIG. 2 of an embodiment.
Figure 4:

FIG. 1 is a perspective view illustrating an electronic device of an embodiment. FIG. 2 is an exploded perspective view of an electronic device according to an embodiment, and FIGS. 3 and 4 are schematic cross-sectional views of an electronic device according to an embodiment. FIG. 3 is a schematic cross-sectional view of the electronic device taken along line I-I' of FIG. 2. FIG. 4 is a schematic cross-sectional view of the electronic device taken along line II-II' of FIG. 2.

An electronic device DD of an embodiment may be a device which may be activated in response to an electric signal. For example, the electronic device DD may be a mobile phone, a tablet, a vehicle navigation device, a game machine, or a wearable device, but is not limited thereto. FIG. 1 illustrates the electronic device DD as a mobile phone.

The electronic device DD may display an image IM through an active region AA-DD. The active region AA-DD may include a plane defined by a first direction axis DR1 and a second direction axis DR2. The active region AA-DD may further include a substantially curved surface that may be bent from at least one or a side of the plane defined by the first direction axis DR1 and the second direction axis DR2. FIG. 1 illustrates the electronic device DD as including two substantially curved surfaces bent from two side surfaces of the plane defined by the first direction axis DR1 and the second axis direction DR2. However, a shape of the active region AA-DD is not limited thereto. For example, the active region AA-DD may include only the plane, or may further include four substantially curved surfaces bent from at least two or more side surfaces, for example, four side surfaces of the plane.

Although FIG. 1 and the following figures illustrate first to third direction axes DR1 to DR3, the directions indicated by the first to third direction axes DR1 to DR3 described herein are relative, and thus may be changed to other directions. Furthermore, the directions indicated by the first to third direction axes DR1 to DR3 may be referred to as first to third directions, and the same reference signs may be used.

Herein, the first direction axis DR1 and the second direction axis DR2 may be perpendicular to each other, and the third direction axis DR3 may be a normal direction to the plane defined by the first direction axis DR1 and the second direction axis DR2.

A sensing region SA-DD may be defined in the active region AA-DD of the electronic device DD. Although FIG. 1 illustrates one or a sensing region SA-DD, the number of sensing regions SA-DD is not limited thereto. The sensing region SA-DD may be a portion of the active region AA-DD. Therefore, the electronic device DD may display an image through the sensing region SA-DD.

An electronic module EM may be arranged or disposed in a region overlapping the sensing region SA-DD. The electronic module EM may receive an external input transferred through the sensing region SA-DD or may provide an output through the sensing region SA-DD.

Referring to FIGS. 1 to 4, the electronic device DD may include the active region AA-DD and a peripheral region NAA-DD adjacent to the active region AA-DD. The active region AA-DD may be a portion corresponding to the display region AA of the display panel DP described below, and the peripheral region NAA-DD may be a portion corresponding to a non-display region NAA of the display panel DP.

The peripheral region NAA-DD, which blocks an optical signal, may be arranged or disposed outside of the active region AA-DD to surround or to be adjacent to the active region AA-DD. In an embodiment, the peripheral region NAA-DD may be arranged or disposed on a side surface rather than a front surface of the electronic device DD. In an embodiment, the peripheral region NAA-DD may be omitted.

The electronic device DD of an embodiment may include the electronic module EM, the display panel DP arranged or disposed on the electronic module EM, a light control layer ARP arranged or disposed on the display panel DP, and a lower polarizing plate PM arranged or disposed between the electronic module EM and the display panel DP. Furthermore, a support member SP may be arranged or disposed under or below the display panel DP, and a through-hole HH which overlaps the electronic module EM may be defined in the support member SP.

The electronic device DD of an embodiment may include a window WM arranged or disposed on the display panel DP. Furthermore, the electronic device DD of an embodiment may include a housing HU arranged or disposed under or below the display panel DP. The electronic module EM and the display panel DP may be accommodated in the housing HU. In the electronic device DD according to an embodiment, the window WM and the housing HU may be combined with each other to form an exterior of the electronic device DD.

The electronic device DD of an embodiment may include one or more adhesive layers AP1 to AP5. A portion of the one or more adhesive layers AP1 to AP5 may be an optically clear adhesive layer. Furthermore, a portion of the one or more adhesive layers AP1 to AP5 may be omitted.

In the electronic device DD according to an embodiment, the electronic module EM may be an electronic component for outputting or receiving an optical signal. For example, the electronic module EM may be a camera module or camera for capturing an external image. Furthermore, the electronic module EM may be a sensor module or sensor such as a proximity sensor or an infrared emission sensor.

In the electronic device DD of an embodiment, the display panel DP may be arranged or disposed on the electronic module EM. The display panel DP may include the display region AA in which the image IM is displayed and the non-display region NAA adjacent to the display region AA. For example, a front surface IS of the display panel DP may include the display region AA and the non-display region NAA. The display region AA may be a region which may be activated in response to an electric signal.

The non-display region NAA may be adjacent to the display region AA. The non-display region NAA may surround the display region AA. A driving circuit or driving wiring for driving the display region AA, various signal lines or pads for providing electric signals to the display region AA, or electronic elements may be arranged or disposed in the non-display region NAA.

The display panel DP may include a first display region SA-EP and a second display region NSA-EP. The first display region SA-EP may be a region overlapping the electronic module EM, and the second display region NSA-EP may be a region surrounding at least a portion of the first display region SA-EP. The first display region SA-EP may correspond to the sensing region SA-DD of the electronic device DD. The second display region NSA-EP may be a portion corresponding to the active region AA-DD except for the sensing region SA-DD in the electronic device DD.

In a plan view, an area of the first display region SA-EP may be smaller than an area of the second display region NSA-EP. The first display region SA-EP and the second display region NSA-EP may have different transmittances. The transmittance of the first display region SA-EP may be higher than the transmittance of the second display region NSA-EP.

In the display panel DP according to an embodiment, a portion of a driving circuit or driving wiring for driving a pixel PX (FIG. 12) arranged or disposed in the first display region SA-EP may be arranged or disposed in the non-display region NAA. Therefore, a wiring density in the first display region SA-EP may be lower than a wiring density in the second display region NSA-EP. However, an embodiment is not limited thereto, and the wiring density in the first display region SA-EP may substantially the same as the wiring density in the second display region NSA-EP.

The display panel DP may include a light-emitting element layer DP-ED (FIG. 10) including an organic light-emitting element, quantum dot light-emitting element, micro LED element, nano LED element, or the like within the spirit and the scope of the disclosure. The light-emitting element layer DP-ED (FIG. 10) may substantially generate an image.

In the electronic device DD of an embodiment, the light control layer ARP may be arranged or disposed on the display panel DP. The light control layer ARP may be arranged or disposed between the display panel DP and the window WM. The light control layer ARP may have an anti-reflection function for reducing reflection of light incident from the outside of the electronic device DD. In an embodiment, the light control layer ARP may be a color filter layer including a plurality of filter portions or a polarizing plate.

Referring to FIGS. 2 to 4, the support member SP may be arranged or disposed under or below the display panel DP. The support member SP may include a cushion layer CM and a metal support layer MP. Furthermore, the support member SP may include one or more adhesive layers AP5. The adhesive layer AP5 may be an optically clear adhesive layer.

The through-hole HH may be defined in the support member SP. The through-hole HH may be defined to pass through the cushion layer CM and the metal support layer MP. Furthermore, the through-hole HH may penetrate the adhesive layer AP5 included in the support member SP so as to be defined likewise.

The through-hole HH may be defined so as to be arranged or disposed in the display region AA of the display panel DP. In the electronic device DD, the first display region SA-EP of the display panel DP may be a portion corresponding to the through-hole HH. The through-hole HH may be a portion corresponding to the sensing region SA-DD of the electronic device DD.

The electronic module EM may overlap the through-hole HH. At least a portion of the electronic module EM may be inserted into the through-hole HH. For example, the electronic module EM may be a camera module including a lens LZ adjacent to the lower polarizing plate PM. In an embodiment, the lens LZ may be inserted into and arranged or disposed in the through-hole HH.

The cushion layer CM may be provided to protect the display panel DP and the electronic module EM from a physical impact applied from the outside of the electronic device DD. Furthermore, the cushion layer CM may have at least a predetermined thickness to implement the through-hole HH. A thickness of the cushion layer CM may be at least about 50 μm. For example, the thickness of the cushion layer CM may be at least about 100 μm.

The cushion layer CM may include at least one of an acryl-based polymer, urethan-based polymer, silicon-based polymer, or imide-based polymer. The cushion layer CM may have a secured strength for protecting the display panel DP and the electronic module EM and defining the through-hole HH.

The adhesive layer AP4 may be arranged or disposed on the cushion layer CM. The adhesive layer AP4 may bond the cushion layer CM and the lower polarizing plate PM.

The metal support layer MP may be a support substrate supporting members included in the electronic device DD, such as the display panel DP. The metal support layer MP may be a thin-film metal substrate. The metal support layer MP may have a function of heat dissipation, electromagnetic wave shielding, or the like within the spirit and the scope of the disclosure.

In the electronic device DD of an embodiment, the support member SP may further include a panel support portion (not shown). The panel support portion (not shown) may be arranged or disposed under or below the lower polarizing plate PM. The panel support portion (not shown) may be arranged or disposed between the lower polarizing plate PM and the cushion layer CM. The panel support portion (not shown) may include a polymer film. The polymer film may be an optically clear polyethylene terephthalate (PET) film.

Furthermore, the support member SP may further include an adhesive layer for bonding the panel support portion (not shown) and the lower polarizing plate PM, wherein the adhesive layer may be an optically clear adhesive layer.

In the electronic device DD according to an embodiment, the window WM may be arranged or disposed on the light control layer ARP. The window WM may cover or overlap the front surface IS of the display panel DP. The window WM may include a base substrate WM-BS and a bezel pattern WM-BZ.

The base substrate WM-BS may be a substrate including an optically clear insulating material. The base substrate WM-BS may have flexibility. For example, the base substrate WM-BS may include a substrate including a polymer film or polymer material or a thin-film glass substrate. The base substrate WM-BS may correspond to a base material having no phase difference or very low phase difference. Functional layers such as an anti-reflection layer, an anti-fingerprint layer, an optical layer for controlling a phase, and the like may be further arranged or disposed on the base substrate WM-BS.

The bezel pattern WM-BZ may be a color layer printed on one or a surface of the base substrate WM-BS or a color layer deposited on the base substrate WM-BS. For example, the bezel pattern WM-BZ may have a multilayer structure. The multilayer structure may include a colored layer and a black light shielding layer. The colored layer and the black light shielding layer may be formed through a deposition, printing, or coating process. The bezel pattern WM-BZ may be omitted, or may be formed or disposed on another functional layer other than the base substrate WM-BS.

The window WM may include an upper surface FS exposed to the outside. The upper surface FS of the electronic device DD may be substantially defined by the upper surface FS of the window WM. In the upper surface FS of the window WM, a transmissive region TA may be an optically clear region. The transmissive region TA may have a shape substantially corresponding to the display region AA of the display panel DP. For example, the transmissive region TA overlaps an entire surface of the display region AA or at least a portion thereof. An image displayed in the display region AA of the display panel DP may be externally viewed through the transmissive region TA.

In the upper surface FS of the window WM, a bezel region BZA may be a portion provided with the bezel pattern WM-BZ. The shape of the transmissive region TA may be defined by the bezel region BZA. The bezel region BZA may be adjacent to and surround the transmissive region TA. The bezel region BZA may cover or overlap the non-display region NAA of the display panel DP to prevent the non-display region NAA from being viewed externally.

The sensing region SA may be defined in the transmissive region TA of the window WM. The sensing region SA of the window may be defined as the sensing region SA-DD of the electronic device DD.

The electronic device DD of an embodiment may further include the adhesive layers AP1 and AP2 arranged or disposed between the light control layer ARP and the window WM and/or between the display panel DP and the light control layer ARP. The adhesive layers AP1 and AP2 may be optically clear adhesive layers.

Figure 5:
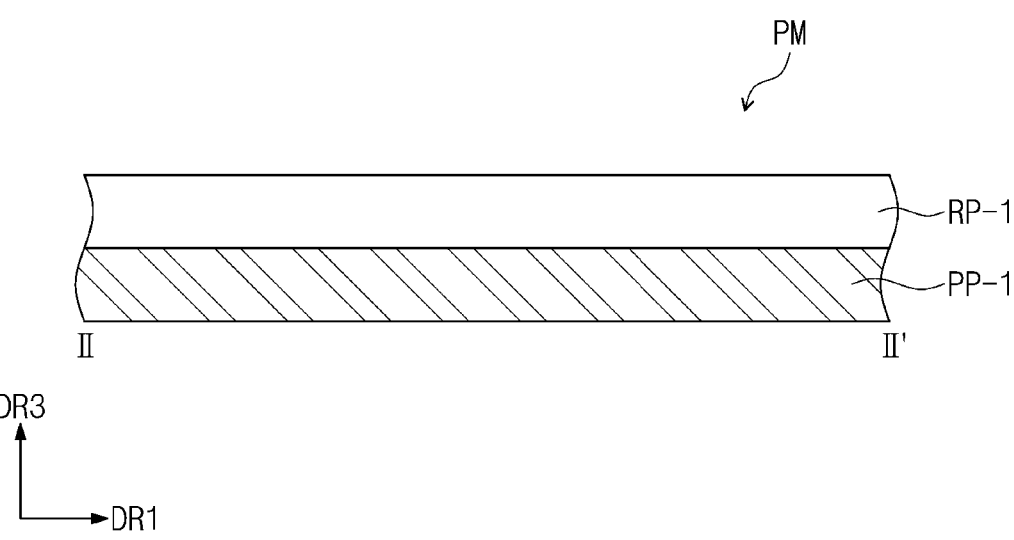
FIG. 5 is a schematic cross-sectional view of a lower polarizing plate according to an embodiment.

The electronic device DD of an embodiment may include the lower polarizing plate PM arranged or disposed between the electronic module EM and the display panel DP. FIG. 5 is a schematic cross-sectional view of a polarizing plate according to an embodiment.

Referring to FIG. 5, in an embodiment, the lower polarizing plate PM may include a first linear polarizing layer PP-1 and a first phase retardation layer RP-1. In an embodiment, the first phase retardation layer RP-1 may be arranged or disposed on the first linear polarizing layer PP-1.

Referring to FIGS. 2 to 5, in the electronic device DD of an embodiment, the lower polarizing plate PM may be arranged or disposed in an optical path of the electronic module EM. For example, in an embodiment, the optical path may be positioned in a direction to the display panel DP in the electronic module EM. In an embodiment, the first linear polarizing layer PP-1 may be arranged or disposed adjacent to the electronic module EM, and the first phase retardation layer RP-1 may be arranged or disposed on the first linear polarizing layer PP-1. The first phase retardation layer RP-1 may be arranged or disposed between the first linear polarizing layer PP-1 and the display panel DP.

In an embodiment, the lower polarizing plate PM may overlap an entirety of the display region AA of the display panel DP. The lower polarizing plate PM may be arranged or disposed under or below the display panel DP so as to overlap both the first display region SA-EP and the second display region NSA-EP. However, in an embodiment, the lower polarizing plate PM may overlap only the first display region SA-EP.

The lower polarizing plate PM may include the first linear polarizing layer PP-1 that linearly polarizes provided light in one or a direction and the first phase retardation layer RP-1 that delays a phase of provided light. The lower polarizing plate PM including the laminated first linear polarizing layer PP-1 and first phase retardation layer RP-1 may be, for example, a circular polarizing plate that circularly polarizes incident light.

The first linear polarizing layer PP-1 may be a film-type linear polarizer including a stretched polymer film For example, the stretched polymer film may be a stretched polyvinyl alcohol-based film. The first linear polarizing layer PP-1 may include a stretched polymer film and a light absorber adsorbed into the polymer film. The light absorber may be a dichroic dye or iodine. For example, the first linear polarizing layer PP-1 may be manufactured by adsorbing iodine into a stretched polyvinyl alcohol film Here, a direction in which the polymer film is stretched may be an absorption axis of the first linear polarizing layer PP-1, and a direction perpendicular to the direction in which the polymer film is stretched may be a transmission axis of the first linear polarizing layer PP-1.

The first linear polarizing layer PP-1 may be provided as a coating layer. Compounds having light absorption characteristics may be arranged or disposed in a certain or given direction and coated so as to provide the first linear polarizing layer PP-1 as an optical coating layer that linearly polarizes provided light in one or a direction.

In an embodiment, the lower polarizing plate PM may include at least one phase retardation layer arranged or disposed on the first linear polarizing layer PP-1. The lower polarizing plate PM may include the first phase retardation layer RP-1 arranged or disposed on the first linear polarizing layer PP-1, wherein the first phase retardation layer RP-1 may include a $\lambda/4$ phase retarder.

The first phase retardation layer RP-1 may have a stretched film form. The first phase retardation layer RP-1 may be formed by biaxially stretching a film. However, an embodiment is not limited thereto, and the first phase retardation layer RP-1 may be a liquid crystal coating layer.

In an embodiment, the lower polarizing plate PM may refer to a structure in which the first linear polarizing layer PP-1 and the first phase retardation layer RP-1 are laminated in an entire region overlapping the display panel DP or a structure in which the first linear polarizing layer PP-1 and the first phase retardation layer RP-1 are laminated in an entire region overlapping at least the electronic module EM. In the lower polarizing plate PM of an embodiment, a degree of polarization of the first linear polarizing layer PP-1 may be generally uniform in an entire region overlapping the display panel DP or in an entire region overlapping the electronic module EM. Furthermore, a light transmittance of the lower polarizing plate PM may be generally uniform in an entire region overlapping the display panel DP or in an entire region overlapping the electronic module EM. However, an embodiment is not limited thereto.

Figure 6:
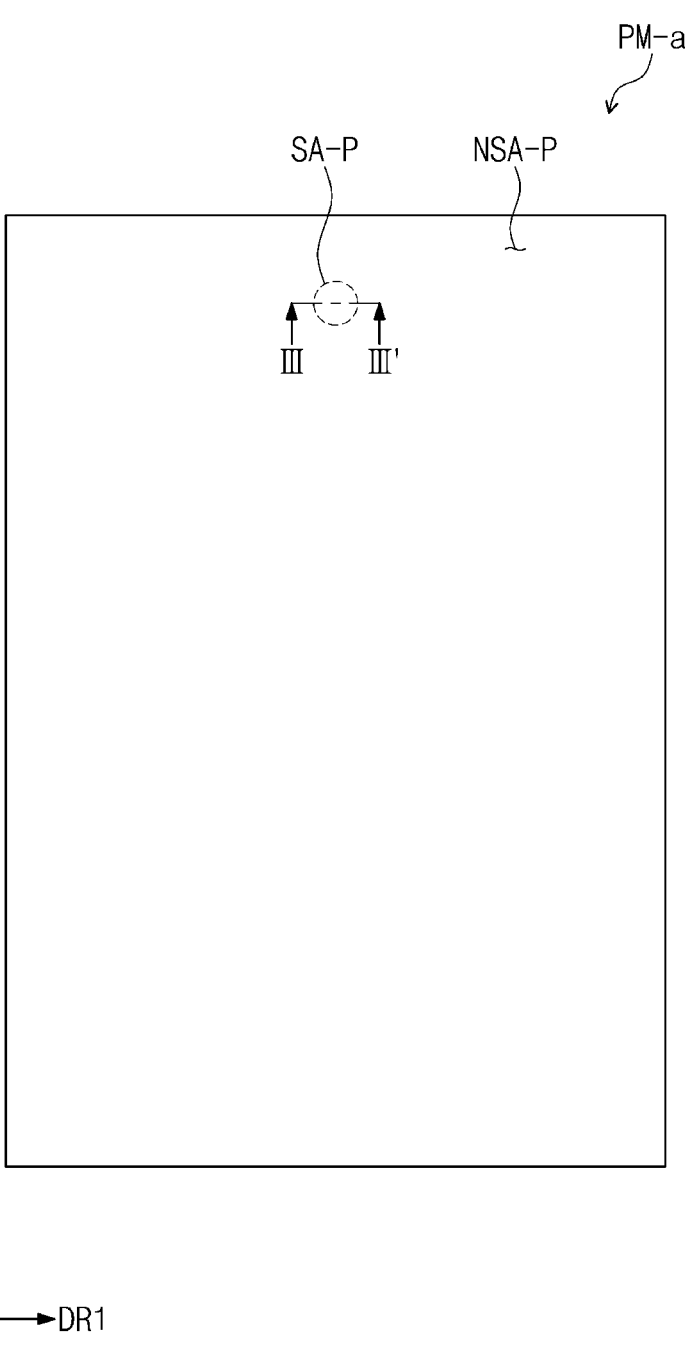
FIG. 6 is a plan view of a lower polarizing plate according to an embodiment.
Figure 7:
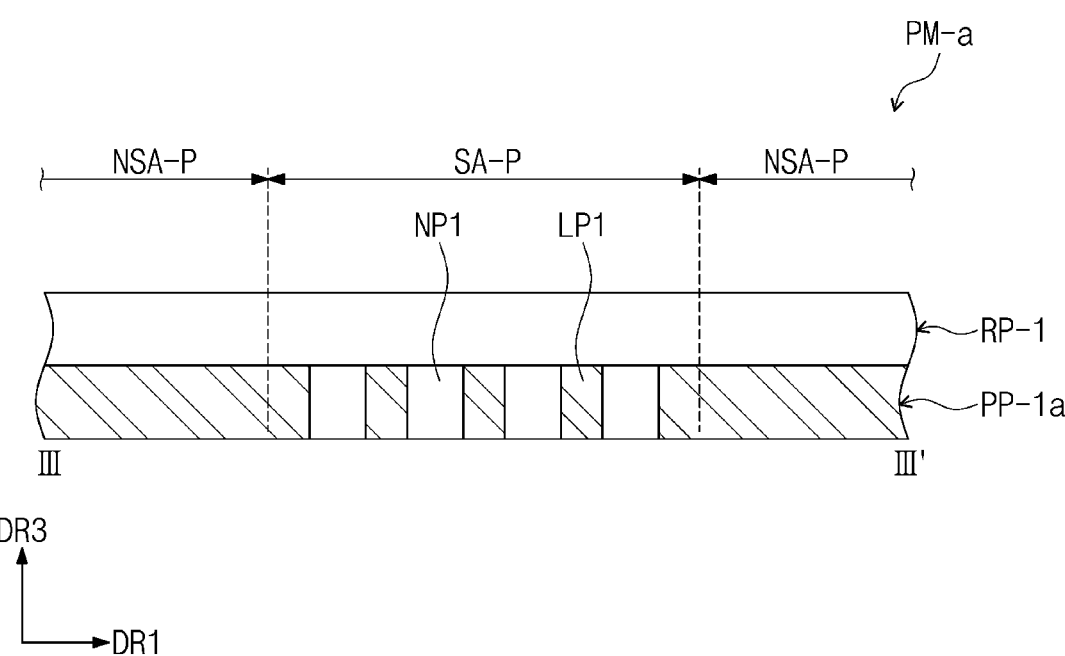
FIG. 7 is a schematic cross-sectional view of a lower polarizing plate corresponding to line III-III' of FIG. 6 according to an embodiment.
Figure 8:
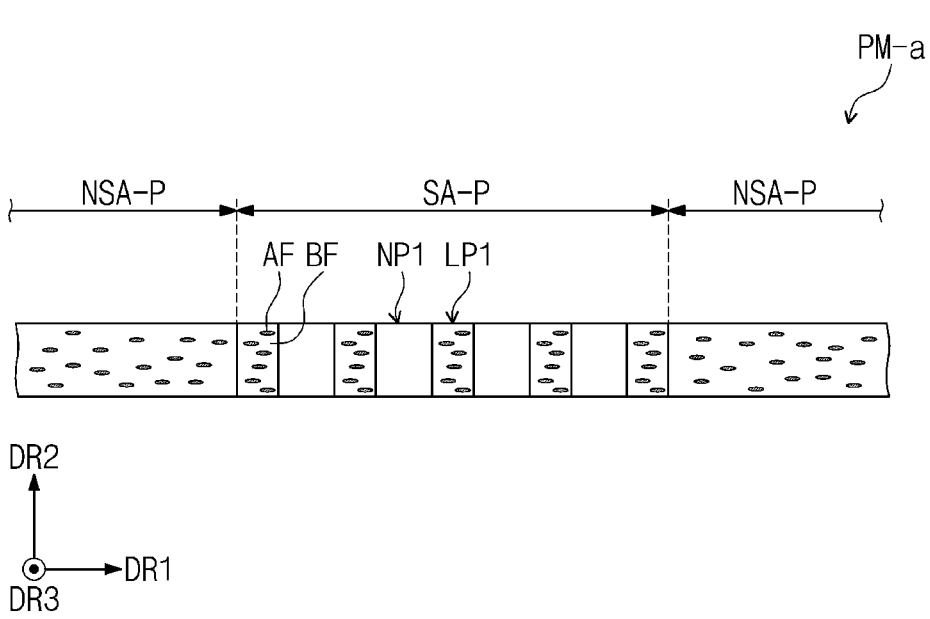
FIG. 8 is a schematic cross-sectional view of a first linear polarizing layer according to an embodiment.

FIG. 6 is a plan view of a lower polarizing plate according to an embodiment. FIG. 7 is a schematic cross-sectional view of a portion of a lower polarizing plate according to an embodiment. FIG. 8 is a schematic cross-sectional view of a portion of a first linear polarizing layer according to an embodiment.

Referring to FIGS. 6 to 8, a lower polarizing plate PM-a according to an embodiment may include a first polarizing region SA-P and a second polarizing region NSA-P having different average transmittances. The lower polarizing plate PM-a according to an embodiment may include the first polarizing region SA-P overlapping the first display region SA-EP (FIG. 2) and the second polarizing region NSA-P overlapping the second display region NSA-EP (FIG. 2). The first polarizing region SA-P may be a portion overlapping the electronic module EM (FIG. 2) and corresponding to the sensing region SA-DD of the electronic device. The second polarizing region NSA-P may surround at least a portion of the first polarizing region SA-P.

The average light transmittance in the first polarizing region SA-P may be higher than the average light transmittance in the second polarizing region NSA-P. For example, the average light transmittance of the lower polarizing plate PM-a may be about 50% or less in the second polarizing region NSA-P. Furthermore, the average light transmittance of the lower polarizing plate PM-a may exceed about 50% in the first polarizing region SA-P. In detail, the average light transmittance of the lower polarizing plate PM-a may be at least about 70% in the first polarizing region SA-P.

FIG. 7 is a schematic cross-sectional view of the portion corresponding to line III-III' of FIG. 6. Referring to FIGS. 6 and 7, the first polarizing region SA-P may include a first polarizing portion LP1 and a first non-polarizing portion NP1. In an embodiment, a first linear polarizing layer PP-1$a$ may include the first polarizing portion LP1 and the first non-polarizing portion NP1.

The lower polarizing plate PM-a according to an embodiment may include the first linear polarizing layer PP-1$a$ including the first polarizing region SA-P and the second polarizing region NSA-P and a first phase retardation layer RP-1 arranged or disposed on the first linear polarizing layer PP-1$a$. In the first polarizing region SA-P, the first linear polarizing layer PP-1$a$ may include the first non-polarizing portion NP1.

Referring to FIG. 8, the first linear polarizing layer PP-1$a$ may include a stretched polymer film BF and a light absorber AF adsorbed into the polymer film BF. The polymer film BF may include polyvinyl alcohol. The light absorber AF may be a dichroic dye or iodine. For example, the first linear polarizing layer PP-1$a$ may be manufactured by adsorbing iodine into a stretched polyvinyl alcohol film.

In an embodiment, the first non-polarizing portion NP1 may be a portion of the polymer film BF of the first linear polarizing layer PP-1$a$ in which the light absorber AF may be desorbed or a portion of the polymer film BF of the first linear polarizing layer PP-1$a$ in which only a small amount of the light absorber AF may be adsorbed.

In an embodiment, the number of light absorbers AF per unit area in the first non-polarizing portion NP1 may be smaller than the number of light absorbers AF per unit area in the first polarizing portion LP1. Furthermore, the number of light absorbers AF per unit area in the second polarizing region NSA-P may be greater than the average number of light absorbers AF per unit area in the first polarizing region SA-P.

In an embodiment, the first non-polarizing portion NP1 may correspond to a portion of the first linear polarizing layer PP-1a which lacks a linear polarization function, and the first polarizing portion LP1 may correspond to a portion of the first linear polarizing layer PP-1a which maintains the linear polarization function. Furthermore, the second polarizing region NSA-P also corresponds to a portion maintaining a linear polarization function.

Figure 9:
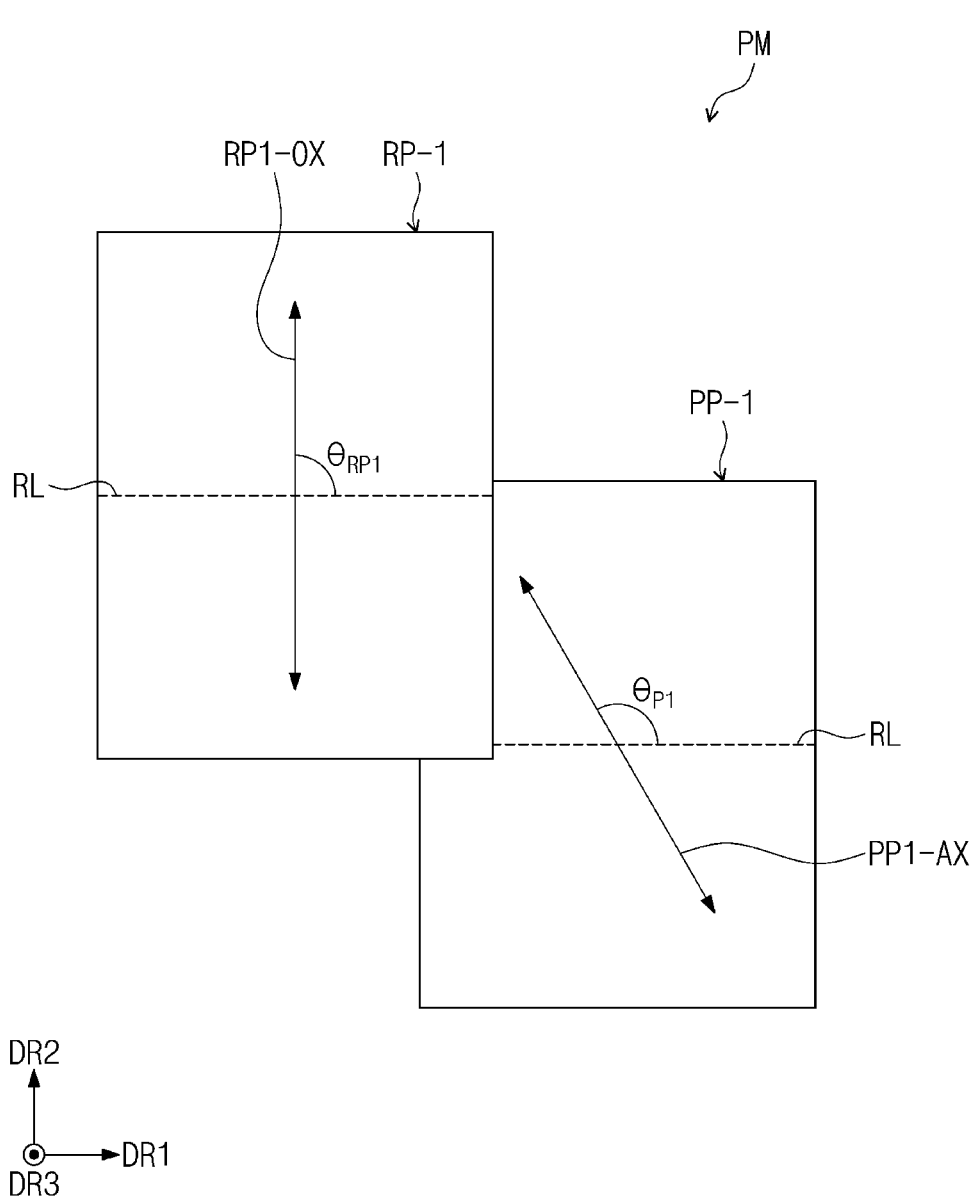
FIG. 9 is a diagram illustrating optical axes in a lower polarizing plate according to an embodiment.

In an embodiment, the light transmittance of the first non-polarizing portion NP1 may be higher than the light transmittance of the first polarizing portion LP1. Furthermore, the light transmittance of the first non-polarizing portion NP1 may be higher than the light transmittance of the second polarizing region NSA-P. The average light transmittance of the first polarizing region SA-P may be an average value of the light transmittances of the first polarizing portion LP1 and the first non-polarizing portion NP1. Therefore, the average light transmittance of the first polarizing region SA-P may be higher than the average light transmittance of the second polarizing region NSA-P. FIG. 9 is a diagram illustrating an optical axis relationship in the lower polarizing plate PM according to an embodiment. In FIG. 9, a reference line RL is illustrated parallel to the first direction axis DR1. An angle between an absorption axis PP1-AX of the first linear polarizing layer PP-1 and an optical axis RP1-OX of the first phase retardation layer RP-1 may be about 45±5 degrees. Herein, the optical axis of phase retardation layers may refer to a fast axis. Herein, the optical axis of phase retardation layers may be parallel with a stretching direction in which a stretch ratio is relatively high.

In an embodiment, the absorption axis PP1-AX of the first linear polarizing layer PP-1 included in the lower polarizing plate PM may have an angle of $\theta_{P1}$ with respect to the reference line RL, the optical axis RP1-OX of the first phase retardation layer RP-1 may have an angle of $\theta_{RP1}$ with respect to the reference line RL, and the angle between the absorption axis PP1-AX of the first linear polarizing layer PP-1 and the optical axis RP1-OX of the first phase retardation layer RP-1 may correspond to a difference between the angle $\theta_{P1}$ and the angle $\theta_{RP1}$.

For example, the angle $\theta_{P1}$ of the absorption axis PP1-AX of the first linear polarizing layer PP-1 with respect to the reference line RL may be about 135±5 degrees. However, an embodiment is not limited thereto, and the angle $\theta_{P1}$ of the absorption axis PP1-AX of the first linear polarizing layer PP-1 may be changed within a range satisfying a condition that the angle between the absorption axis PP1-AX of the first linear polarizing layer PP-1 and the optical axis RP1-OX of the first phase retardation layer RP-1 be about 45±5 degrees.

The optical axis relationship between the first linear polarizing layer PP-1 and the first phase retardation layer RP-1 described above with reference to FIG. 9 may also be applied to an embodiment of the lower polarizing plate PM-a described with reference to FIGS. 7 and 8.

Figure 10:
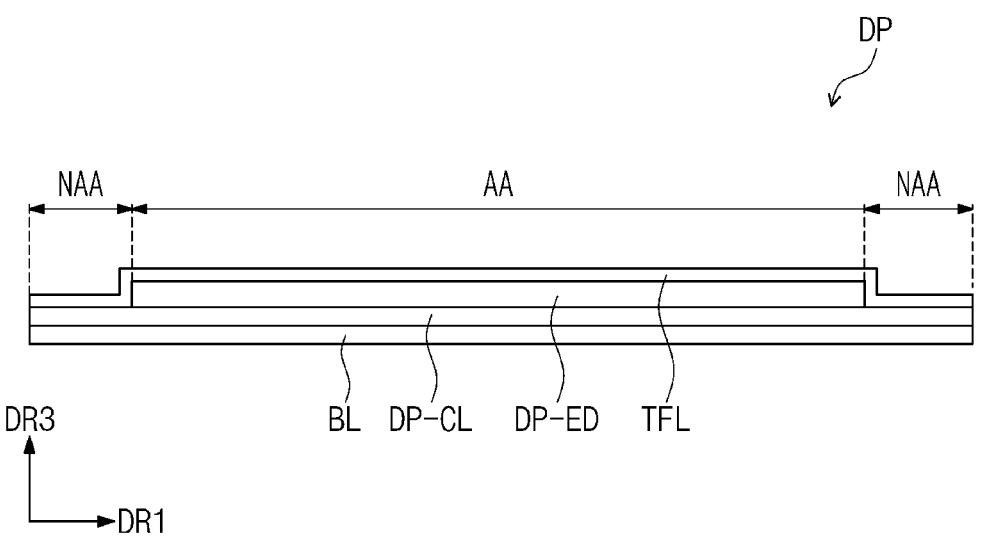
FIG. 10 is a schematic cross-sectional view of a display panel according to an embodiment.
Figure 11:
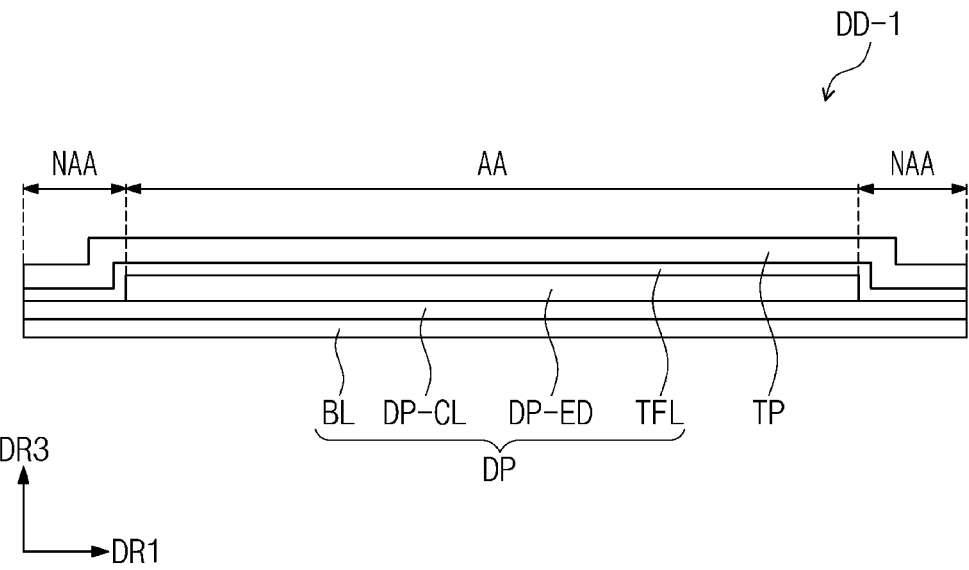
FIG. 11 is a schematic cross-sectional view of a display panel according to an embodiment.
Figure 12:
FIG. 12 is a plan view of a display panel according to an embodiment.

FIG. 10 is a schematic cross-sectional view of a display panel according to an embodiment, and FIG. 11 is a schematic cross-sectional view of an electronic device according to an embodiment. FIG. 12 is a plan view of a display panel according to an embodiment.

In an embodiment, the display panel DP may include a base layer BL, and a circuit layer DP-CL, the light-emitting element layer DP-ED, and an upper insulating layer TFL arranged or disposed on the base layer BL. The base layer BL may include a plastic substrate, a glass substrate, a metal substrate, an organic/inorganic composite material substrate, etc. For example, the base layer BL may include at least one polyimide layer.

Figure 17:
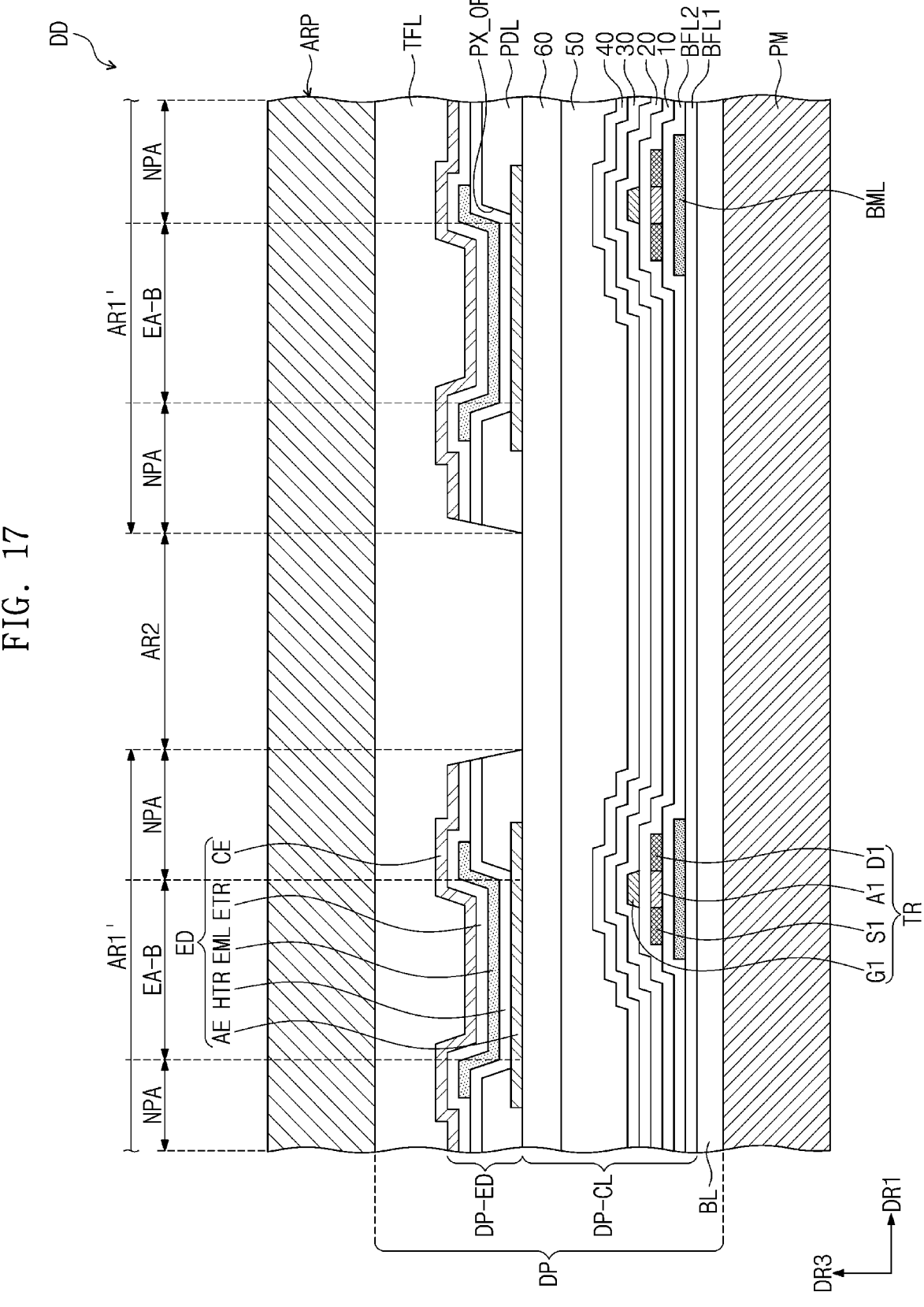
FIG. 17 is a schematic cross-sectional view of an electronic device of an embodiment.

The circuit layer DP-CL may include one or more insulating layers, semiconductor patterns, and conductive patterns. The insulating layer may include at least one inorganic layer and at least one organic layer. The semiconductor patterns and the conductive patterns may constitute signal lines, a pixel driving circuit, and a scan driving circuit. Furthermore, the circuit layer DP-CL may include a shielding pattern BML (FIG. 17). The circuit layer DP-CL will be described in detail later.

The light-emitting element layer DP-ED may include a display element, for example, a light-emitting element ED (FIG. 17). The light-emitting element layer DP-ED may further include an organic layer such as a pixel defining film PDL (FIG. 17).

The light-emitting element layer DP-ED may be arranged or disposed in the display region AA. The non-display region NAA may be arranged or disposed on a periphery of the display region AA and surrounds or may be adjacent to the display region AA, and a light-emitting element may not be arranged or disposed in the non-display region NAA.

The upper insulating layer TFL may include a plurality of thin films A portion of the thin films may be arranged or disposed to improve optical efficiency, and another portion of the thin films may be arranged or disposed to protect light-emitting elements. The upper insulating layer TFL may include a thin-film encapsulation layer including a lamination structure of inorganic layer/organic layer/inorganic layer.

An electronic device DD-1 according to an embodiment may further include the display panel DP and a sensor layer TP arranged or disposed on the display panel DP. The sensor layer TP may detect an external input applied externally. The external input may be a user's input. The user's input may include various types of external inputs such as a part of a user's body, light, heat, pen, or pressure.

The sensor layer TP may be formed or disposed on the upper insulating layer TFL through a continuous process. The sensor layer TP may be referred to as being arranged or disposed (for example, directly arranged or disposed) on the upper insulating layer TFL. Being directly arranged or disposed may indicate that a third component may not be arranged or disposed between the sensor layer TP and the upper insulating layer TFL. For example, an additional adhesive member may not be arranged or disposed between the sensor layer TP and the upper insulating layer TFL. However, an embodiment is not limited thereto, and an adhesive member (not shown) may be further arranged or disposed between the sensor layer TP and the upper insulating layer TFL. In an embodiment, the sensor layer TP may include sensing electrodes for detecting an external input, wherein the sensing electrodes may include a transparent metal oxide or the like within the spirit and the scope of the disclosure.

As illustrated in FIG. 12, the display panel DP may include a plurality of signal lines SGL, a plurality of pixels PX, and a driving circuit GDC. The pixels PX are arranged or disposed in the display region AA. Each of the pixels PX may include a light-emitting element and a pixel driving circuit electrically connected thereto. The signal lines SGL and the pixel driving circuit may be included in the circuit layer DP-CL illustrated in FIG. 10 or 11.

The first display region SA-EP may be a portion having a lower pixel density or lower wiring density than that of the second display region NSA-EP.

For example, in an electronic device of an embodiment, fewer pixels PX may be arranged or disposed in the first display region SA-EP than in the second display region NSA-EP with respect to the same unit area. A region in which the pixels PX may not be arranged or disposed may correspond to a region through which an optical signal is transmitted. However, an embodiment is not limited thereto, and the first display region SA-EP may have substantially the same pixel density as that of the second display region NSA-EP.

In the case where the first display region SA-EP and the second display region NSA-EP have substantially the same pixel density, the wiring density of the first display region SA-EP may be lower than the wiring density of the second display region NSA-EP. For example, circuit wiring such as a transistor TR (FIG. 17) for driving a second pixel unit AR1' (FIG. 17) arranged or disposed in the first display region SA-EP may be moved to and arranged or disposed in the non-display region NAA. Therefore, compared to the second display region NSA-EP, the first display region SA-EP may have a lower wiring density.

The pixels PX are not arranged or disposed in the non-display region NAA. The driving circuit GDC may be arranged or disposed in the non-display region NAA. In an embodiment, the driving circuit GDC may include a scan driving circuit. The scan driving circuit generates a plurality of scan signals, and sequentially outputs the scan signals to a plurality of scan lines GL that will be described later. The scan driving circuit may further output another control signal to the driving circuit of the pixels PX.

The scan driving circuit may include a plurality of thin-film transistors formed through the same process as for the driving circuit of the pixels PX, for example, a low temperature polycrystalline silicon (LTPS) process or a low temperature polycrystalline oxide (LTPO) process.

The signal lines SGL include scan lines GL, data lines DL and DL1, power supply line PWL, and control signal line CSL. The signal lines SGL may further include additional reset lines and light-emitting lines. The scan lines GL may be respectively electrically connected to corresponding pixels PX, and the data lines DL and DL1 may be respectively electrically connected to corresponding pixels PX. The power supply line PWL may be electrically connected to the pixels PX. The control signal line CSL may provide control signals to the scan driving circuit.

The signal lines SGL may be electrically connected to a circuit board (not shown). The signal lines SGL may be electrically connected to an integrated chip-type timing control circuit mounted or disposed on the circuit board.

In the display panel DP according to an embodiment, the first display region SA-EP may be a portion overlapping the electronic module EM. For example, the first display region SA-EP may be a portion overlapping a lens of a camera module.

Figure 13:
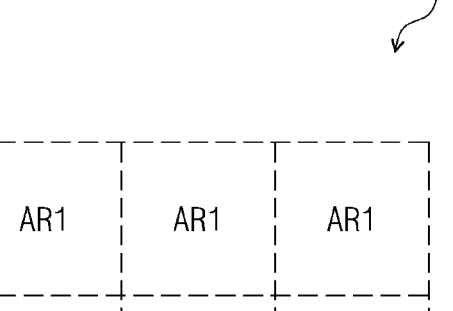
FIG. 13 is a plan view of a portion a display panel according to an embodiment.
Figure 13:
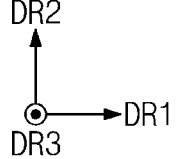
Figure 14:
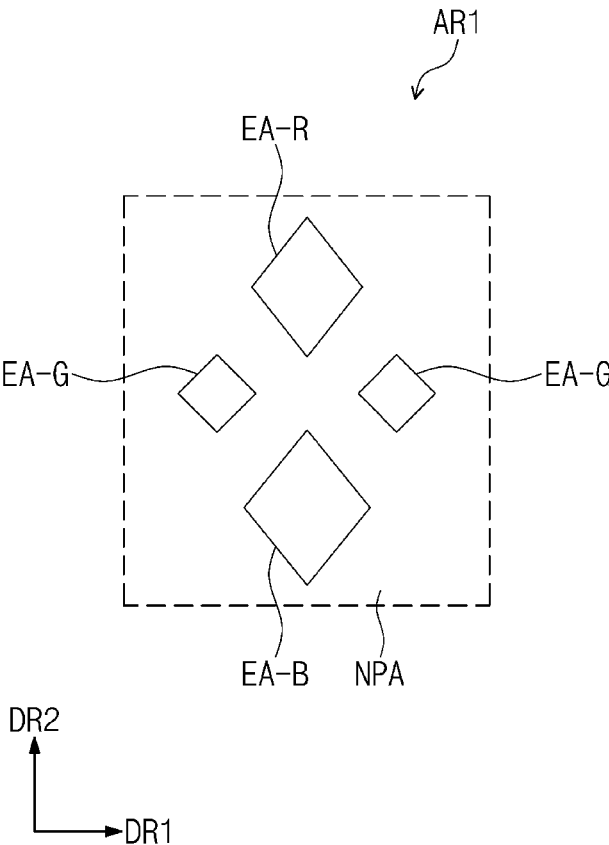
FIG. 14 is a plan view of a pixel unit according to an embodiment.

FIG. 13 is a plan view of the region AA' of FIG. 12. FIG. 13 simplifies and illustrates pixel units arranged or disposed in the region AA' of FIG. 12. FIG. 14 is a plan view illustrating a configuration of light-emitting regions included in one of the pixel units illustrated in FIG. 13.

A pixel may be arranged or disposed in a first pixel unit AR1, wherein the first pixel unit AR1 may be a region providing an image. Therefore, the first pixel unit AR1 may be referred to as a valid region.

Referring to FIGS. 12 to 14, a plurality of first pixel units AR1 arranged or disposed in the second display region NSA-EP may have the same arrangement of light-emitting regions EA-B, EA-G, and EA-R. A first light-emitting region EA-B is a light-emitting region of a first-color pixel, a second light-emitting region EA-G is a light-emitting region of a second-color pixel, and a third light-emitting region EA-R is a light-emitting region of a third-color pixel.

The plurality of first pixel units AR1 may include the first light-emitting region EA-B, the second light-emitting region EA-G, and the third light-emitting region EA-R. In an embodiment, each of the plurality of first pixel units AR1 is illustrated as including one first light-emitting region EA-B, two second light-emitting regions EA-G, and one third light-emitting region EA-R. However, an embodiment is not limited thereto.

Furthermore, although the light-emitting regions EA-B, EA-G, and EA-R included in the first pixel unit AR1 are illustrated as having a substantially rhombus shape in a plan view, an embodiment is not limited thereto.

Referring to FIG. 14, in one first pixel unit AR1, the two second light-emitting regions EA-G may be arranged or disposed spaced apart from each other in the direction of the first direction axis DR1, and the first light-emitting region EA-B and the third light-emitting region EA-R may be arranged or disposed spaced apart from each other with the second light-emitting regions EA-G therebetween. The light-emitting regions EA-B, EA-G, and EA-R may be separated from each other by a non-light emitting region NPA. The light-emitting regions EA-B, EA-G, and EA-R may be regions separated by the pixel defining film PDL (FIG. 17), and the non-light emitting region NPA may be a region overlapping the pixel defining film PDL (FIG. 17).

In an embodiment, one of the two second light-emitting regions EA-G included in one first pixel unit AR1 may be defined as a fourth light-emitting region differentiated from the second light-emitting region EA-G. Although FIG. 14 illustrates the two second light-emitting regions EA-G as having the same shape and the same area in a plan view, an embodiment is not limited thereto. Unlike the illustration, the second light-emitting region EA-G and the fourth light-emitting region may have different shapes in a plan view in an embodiment.

In an embodiment, the configuration of the first pixel units AR1 included in the second display region NSA-EP is not limited to the configuration illustrated in the drawings, and the number of light-emitting regions included in one pixel unit AR1, an area ratio between different light-emitting regions, an arrangement relationship between light-emitting regions, and shapes of light-emitting regions may be variously changed or combined according to a display quality required from the display panel DP.

In an embodiment, one first light-emitting region EA-B may generate blue light. Each of the two second light-emitting regions EA-G may generate green light. One third light-emitting region EA-R may generate red light. The blue light, green light, and red light may be changed to three other primary color lights.

Figure 15:
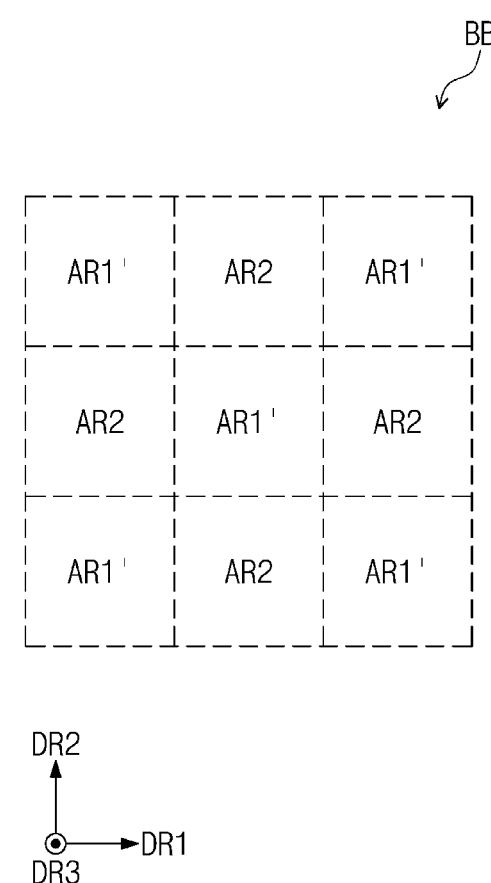
FIG. 15 is a plan view of a portion of a display panel according to an embodiment.
Figure 16:
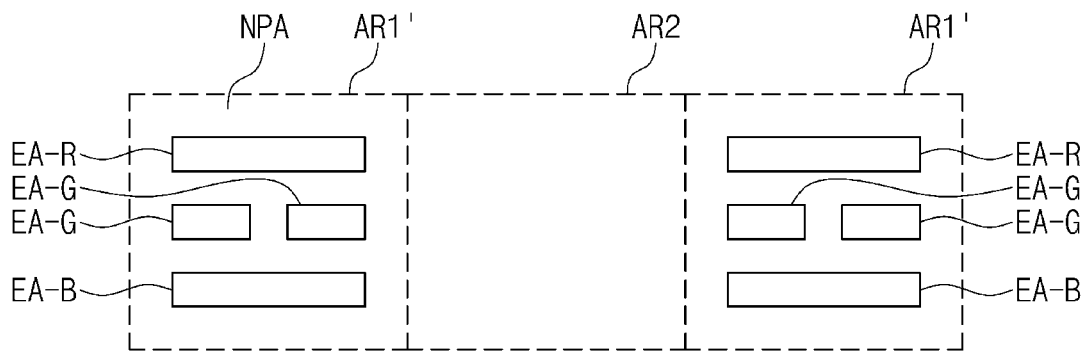
FIG. 16 is a plan view illustrating a configuration of a pixel unit and non-pixel unit according to an embodiment.

FIG. 15 is a plan view of the region BB' of FIG. 12. FIG. 15 simplifies and illustrates pixel units arranged or disposed in the region BB' of FIG. 12. FIG. 16 is a plan view of a portion of the region BB' illustrated in FIG. 15.

FIG. 15 is a plan view illustrating the region BB' that is a portion of the first display region SA-EP of the display panel DP illustrated in FIG. 12. The first display region SA-EP may include a plurality of second pixel units AR1' and a plurality of non-pixel units AR2.

Referring to FIGS. 12 to 16, the first display region SA-EP may include the second pixel units AR1' and non-pixel units AR2 arranged or disposed alternately. The plurality of second pixel units AR1' and the plurality of non-pixel units AR2 may be arranged or disposed according to a predetermined rule.

A pixel may be arranged or disposed in the second pixel unit AR1', wherein the second pixel unit AR1' may be a region providing an image. Therefore, the second pixel unit AR1' may be referred to as a valid region.

The light transmittance of the non-pixel unit AR2 may be higher than the light transmittance of the second pixel unit AR1'. The non-pixel unit AR2 may be referred to as a transmissive portion, a non-display portion, a semi-transmissive portion, a transmissive region, a non-pixel region, an opening, an open region, or the like within the spirit and the scope of the disclosure.

A pixel may not be arranged or disposed in the non-pixel unit AR2. At least a light-emitting element may not be arranged or disposed in the non-pixel unit AR2. Therefore, a resolution of the first display region SA-EP including the second pixel unit AR1' and the non-pixel unit AR2 may be lower than a resolution of the second display region NSA-EP.

Semiconductor patterns, conductive patterns, metal patterns, or signal lines may not be arranged or disposed in the non-pixel unit AR2. Furthermore, a reflective electrode, a non-transmissive electrode, or the like may not be arranged or disposed in the non-pixel unit AR2. Furthermore, an optical signal may be substantially moved through the non-pixel unit AR2. For example, a signal provided from the electronic module EM (FIG. 4) may be output externally via the non-pixel unit AR2, or an externally input signal may be received by the electronic module EM (FIG. 4) via the non-pixel unit AR2.

Referring to FIG. 15, the second pixel units AR1' and the non-pixel units AR2 may be alternately arranged or disposed along the first direction axis DR1 and the second direction axis DR2. For example, one second pixel unit AR1' and one non-pixel unit AR2 may be alternately arranged or disposed. The non-pixel unit AR2 may have an area corresponding to an area of the second pixel unit AR1'. However, an embodiment is not limited thereto, and the non-pixel unit AR2 may not necessarily have the same area as the second pixel unit AR1'.

Furthermore, the arrangement of the second pixel units AR1' and non-pixel units AR2 is not limited to the arrangement illustrated in FIG. 15. In the first display region SA-EP, a ratio between the number of second pixel units AR1' and the number of non-pixel units AR2 may differ from the ratio illustrated in FIG. 15. In an embodiment, the non-pixel units AR2 may be arranged or disposed in a stripe form along the first direction axis DR1 or the second direction axis DR2, or the second pixel units AR1' and the non-pixel units AR2 may be arranged or disposed so that the number of repetitions of the second pixel units AR1' is different from that of the non-pixel units AR2.

FIG. 16 is a plan view illustrating, in more detail, the configuration of the second pixel unit AR1' and non-pixel unit AR2 of the first display region SA-EP. In an embodiment, the non-pixel unit AR2 may be arranged or disposed between the second pixel units AR1'.

As illustrated in FIG. 16, the second pixel unit AR1' may include at least three light-emitting regions EA-B, EA-G, and EA-R. The second pixel units AR1' may include the first light-emitting region EA-B, the second light-emitting region EA-G, and the third light-emitting region EA-R. In an embodiment, each of the plurality of second pixel units AR1' is illustrated as including one first light-emitting region EA-B, two second light-emitting regions EA-G, and one third light-emitting region EA-R. However, an embodiment is not limited thereto.

Furthermore, although the light-emitting regions EA-B, EA-G, and EA-R included in the second pixel unit AR1' are illustrated as having a substantially rectangular shape in a plan view, an embodiment is not limited thereto.

Referring to FIG. 16, in one second pixel unit AR1', the two second light-emitting regions EA-G may be arranged or disposed spaced apart from each other, and the first light-emitting region EA-B and the third light-emitting region EA-R may be arranged or disposed spaced apart from each other with the second light-emitting regions EA-G therebetween. The light-emitting regions EA-B, EA-G, and EA-R may be separated from each other by a non-light emitting region NPA. In a case that the second pixel unit AR1' may include at least three light-emitting regions EA-B, EA-G, and EA-R, the non-pixel unit AR2 may have an area may be greater than a sum of areas of at least two among the three light-emitting regions EA-B, EA-G, and EA-R.

Referring to FIGS. 14 and 16, the first pixel unit AR1 and the second pixel unit AR1' may differ from each other with respect to an arrangement form of light-emitting regions and shapes of light-emitting regions. The sizes and arrangement of the light-emitting regions included in the first pixel unit AR1 and the second pixel unit AR1', an area ratio between different light-emitting regions, and the shapes of the light-emitting regions are not limited to those illustrated in FIGS. 14 and 16.

Furthermore, unlike the illustration, the first pixel unit AR1 and the second pixel unit AR1' may have the same configuration of light-emitting regions in an embodiment.

In an embodiment, the second pixel unit AR1' may differ in size from the first pixel unit AR1. For example, the size of the second pixel unit AR1' may be greater than the size of the first pixel unit AR1. However, an embodiment is not limited thereto.

The region AA' illustrated in FIG. 13 and the region BB' illustrated in FIG. 15 may be regions occupying the same unit area. Referring to FIGS. 12 to 16, the number of light-emitting regions per unit area (BB') in the first display region SA-EP may be smaller than the number of light-emitting regions per unit area (AA') in the second display region NSA-EP. The number of pixel units AR1' per unit area in the first display region SA-EP may be smaller than the number of pixel units AR1 per unit area in the second display region NSA-EP. Furthermore, a pixel density in the first display region SA-EP may be lower than a pixel density in the second display region NSA-EP. However, an embodiment is not limited thereto, and the pixel density in the first display region SA-EP and the pixel density in the second display region NSA-EP may be substantially the same, and the wiring density in the first display region SA-EP may be lower than the wiring density in the second display region NSA-EP.

FIG. 17 is a schematic cross-sectional view of a portion of a first display region of an electronic device according to an embodiment. Referring to FIG. 17, the electronic device DD of an embodiment may include the display panel DP, the light control layer ARP arranged or disposed on the display panel DP, and the lower polarizing plate PM arranged or disposed under or below the display panel DP. As illustrated in FIG. 17, the adhesive layers AP2 and AP3 (FIG. 4) arranged or disposed between the display panel DP and the lower polarizing plate PM and between the display panel DP and the light control layer ARP may be omitted.

In an embodiment, the display panel DP may include a plurality of insulating layers, a semiconductor pattern, a conductive patterns, a metal pattern, a signal line, and the like within the spirit and the scope of the disclosure. An insulating layer, semiconductor layer, conductive layer, and metal layer are formed through coating, deposition, or the like within the spirit and the scope of the disclosure. Thereafter, the insulating layer, the semiconductor layer, the conductive layer, and the metal layer may be selectively patterned through photolithography. In this manner, semiconductor patterns, conductive patterns, shielding patterns, metal patterns, and signal lines included in the circuit layer DP-CL and light-emitting element layer DP-ED may be formed. Thereafter, the upper insulating layer TFL that covers or overlaps the light-emitting element layer DP-ED may be formed or disposed.

The transistor TR and the light-emitting element ED may be arranged or disposed on the base layer BL. The light-emitting element ED may include a first electrode AE, a second electrode CE, and an emission layer EML arranged or disposed between the first electrode AE and the second electrode CE. Furthermore, the light-emitting element ED may include a hole transport region HTR arranged or disposed between the first electrode AE and the emission layer EML and an electron transport region ETR arranged or disposed between the emission layer EML and the second electrode CE.

A first buffer layer BFL1 may be arranged or disposed on the base layer BL. The first buffer layer BFL1 may improve a bonding force between a metal pattern such as the shielding pattern BML and the base layer BL. The first buffer layer BFL1 may include at least one of silicon oxide layer, silicon nitride layer, or silicon oxynitride layer, wherein the silicon oxide layer, the silicon nitride layer, and the silicon oxynitride layer may be alternately stacked each other.

The shielding pattern BML may be arranged or disposed on the first buffer layer BFL1. In an embodiment, the first buffer layer BFL1 may be omitted, and the shielding pattern BML may be provided or disposed on an upper surface of the base layer BL.

The shielding pattern BML may overlap the transistor TR. The shielding pattern BML may serve as a protective layer that overlaps an active A1 to prevent deterioration of an electric characteristic of an active pattern. Furthermore, the shielding pattern BML may protect the transistor TR from light or moisture coming from under or below the base layer BL during a manufacturing process of an electronic device. The shielding pattern BML may be formed of a metal material having a low light transmittance. For example, the shielding pattern BML may be a metal pattern including molybdenum (Mo) or the like within the spirit and the scope of the disclosure.

Light incident onto the shielding pattern BML may be reflected from an upper surface or lower surface of the shielding pattern BML. Light incident onto the shielding pattern BML from under or below the shielding pattern BML may be reflected from the shielding pattern BML and may be incident onto the lower polarizing plate PM. The lower polarizing plate PM, which may include a phase retardation layer and a linear polarizing layer, may prevent the incident light that was reflected from the shielding pattern BML from being emitted back. Accordingly, the electronic device DD of an embodiment, which may include the lower polarizing plate PM arranged or disposed under or below the display panel DP, may exhibit characteristics that prevent deterioration of display quality due to reflected light from the shielding pattern BML or deterioration of image capture quality due to reflected light from the shielding pattern BML. In an embodiment, a second buffer layer BFL2 may be arranged or disposed on the shielding pattern BML. The second buffer layer BFL2 may cover or overlap an entirety of the shielding pattern BML. The second buffer layer BFL2 may include at least one of a silicon oxide layer, a silicon nitride layer, or a silicon oxynitride layer.

A semiconductor pattern may be arranged or disposed on the second buffer layer BFL2. The semiconductor pattern may include a silicon semiconductor. The semiconductor pattern may include polysilicon or amorphous silicon. Furthermore, the semiconductor pattern may include a metal oxide semiconductor.

The semiconductor pattern may have different electric properties according to whether the semiconductor pattern is doped. The semiconductor pattern may include a doped region and a non-doped region according to a doping level. The doped region may be doped with an N-type dopant or P-type dopant. A P-type transistor may include a doped region doped with a P-type dopant.

The doped region may have a higher doping concentration and higher conductivity than the non-doped region. The doped region may substantially serve as an electrode or a signal line. The non-doped region may correspond to an active (or channel) of a transistor. In other words, a portion of the semiconductor pattern may be an active (or channel) of a transistor, another portion may be a source (or input electrode region) or drain (or output electrode region) of the transistor, and another portion may be a connection signal line (or connection electrode). However, an embodiment is not limited thereto, and the active (or channel) of the transistor may also be doped with a dopant.

As illustrated in FIG. 17, a source S1, active A1, and drain D1 of the transistor TR are formed from the semiconductor pattern. A first insulating layer 10 may be arranged or disposed on the semiconductor pattern. A gate G1 of the transistor TR may be arranged or disposed on the first insulating layer 10. A second insulating layer 20 may be arranged or disposed on the gate G1. Third to fifth insulating layers 30 to 50 may be arranged or disposed on the second insulating layer 20.

Although not illustrated, a connection electrode (not shown) may electrically connect the transistor TR and the light-emitting element ED. For example, the connection electrode (not shown) may electrically connect the transistor TR and the light-emitting element ED through contact holes defined in the third to fifth insulating layers 30 to 50. A sixth insulating layer 60 may be arranged or disposed on the fifth insulating layer 50. Although FIG. 17 illustrates the first to sixth insulating layers 10 to 60 laminated, the number of insulating layers may be increased or decreased unlike the illustration of FIG. 17.

Layers from the first buffer layer BFL1 to the sixth insulating layer 60 may be defined as the circuit layer DP-CL. The circuit layer DP-CL may include at least one metal pattern such as the shielding pattern BML, the semiconductor patterns S1, A1, and D1, the gate G1, and the connection electrode (not shown). The at least one metal pattern may not be included in the non-pixel unit AR2. The non-pixel unit AR2 may not include the shielding pattern BML, the semiconductor patterns S1, A1, and D1, and the gate G1, but may include a plurality of insulating layers. The non-pixel unit AR2 may correspond to a transmissive region having a higher light transmittance compared to the pixel units AR1 and AR1'. In the electronic device DD of an embodiment, a portion corresponding to the non-pixel unit AR2 may be referred to as a non-pixel region, and a portion corresponding to the pixel units AR1 and AR1' may be referred to as a pixel region.

The light transmittance of light transmitted through the light control layer ARP and lower polarizing plate PM overlapping the non-pixel region may be higher than the light transmittance of light transmitted through the light control layer ARP and lower polarizing plate PM overlapping the pixel region. Since the non-pixel region does not include a metal pattern such as the shielding pattern BML, the semiconductor patterns S1, A1, and D1, the gate G1, or the connection electrode (not shown), an optical signal may be easily transferred from the outside to the side of the electronic module EM (FIG. 4) even in a structure overlapping the light control layer ARP and lower polarizing plate PM. The first electrode AE may be arranged or disposed on the sixth insulating layer 60. The first electrode AE may be an anode electrode. The pixel defining film PDL may be arranged or disposed on the first electrode AE and the sixth insulating layer 60. An opening PX_OP may be defined in the pixel defining film PDL to expose a predetermined portion of the first electrode AE.

The pixel defining film PDL may be formed of a polymer resin. For example, the pixel defining film PDL may include a polyacrylate-based resin or polyimide-based resin. Furthermore, the pixel defining film PDL may further include an inorganic material in addition to a polymer resin. The pixel defining film PDL may include a light absorbing material or a black pigment or black dye. The pixel defining film PDL including a black pigment or black dye may form a black pixel defming film. Carbon black or the like may be used as a black pigment or black dye in a case that forming the pixel defining film PDL, but an embodiment is not limited thereto.

The hole transport region HTR may be arranged or disposed on the first electrode AE and the pixel defining film PDL. The hole transport region HTR may be arranged or disposed commonly in the light-emitting region EA-B and the non-light emitting region NPA. The hole transport region HTR may include a hole transport layer and a hole injection layer.

The emission layer EML may be arranged or disposed on the hole transport region HTR. The emission layer EML may be arranged or disposed in a region corresponding to the opening PX_OP. The emission layer EML may include an organic material and/or an inorganic material. In FIG. 17, the emission layer EML may be a portion emitting blue light. The emission layer may emit green light in the second light-emitting region EA-G (FIG. 16), and the emission layer may emit red light in the third light-emitting region EA-R (FIG. 16). The second light-emitting region EA-G (FIG. 16) and the third light-emitting region EA-R (FIG. 16) may also have a lamination structure corresponding to the first light-emitting region EA-B illustrated in FIG. 17.

The electron transport region ETR may be arranged or disposed on the emission layer EML and the hole transport region HTR. The electron transport region ETR may be arranged or disposed commonly in the light-emitting region EA-B and the non-light emitting region NPA. The electron transport region ETR may include an electron transport layer and an electronic injection layer.

The second electrode CE may be arranged or disposed on the electron transport region ETR. The second electrode CE may be a cathode electrode. The second electrode CE may be provided as a common layer.

Although the hole transport region HTR, the electron transport region ETR, and the second electrode CE are illustrated as extending to the non-light emitting region NPA in an embodiment, an embodiment is not limited thereto. Thus, the hole transport region HTR, the electron transport region ETR, and the second electrode CE may be patterned to correspond to the light-emitting region.

A layer in which the light-emitting element ED may be arranged or disposed may be defined as the light-emitting element layer DP-ED. The upper insulating layer TFL may be arranged or disposed on the light-emitting element ED.

The first electrode AE may not be included in the non-pixel unit AR2. The non-pixel unit AR2 may overlap the upper insulating layer TFL. Furthermore, although not illustrated in the drawings, the non-pixel unit AR2 may include at least a portion of the second electrode CE in the case where the second electrode CE may be a transparent electrode.

In a portion corresponding to the non-pixel unit AR2, an optical signal provided from the outside of the electronic device DD may be transmitted through the light control layer ARP, the display panel DP, and the lower polarizing plate PM and provided to the electronic module EM (FIG. 4), or an optical signal emitted from the electronic module EM (FIG. 4) may be sequentially transmitted through the lower polarizing plate PM, the display panel DP, and the light control layer ARP and provided to the outside of the electronic device DD. For example, since the metal pattern or conductive pattern included in the circuit layer DP-CL of the display panel DP may not be arranged or disposed in the portion corresponding to the non-pixel unit AR2, an optical signal provided as transmission light may be freely transmitted. Furthermore, in the case of an electronic device of an embodiment, the lower polarizing plate PM may be arranged or disposed under or below the circuit layer DP-CL including a metal pattern layer that reflects an optical signal, such as a shielding pattern or a semiconductor pattern, and thus light reflected from the metal pattern layer and provided to the side of the lower polarizing plate PM is prevented from being emitted back, thereby preventing deterioration of sensitivity of an electronic module in the non-pixel unit AR2 and deterioration of display quality due to the electronic module.

Figure 18:
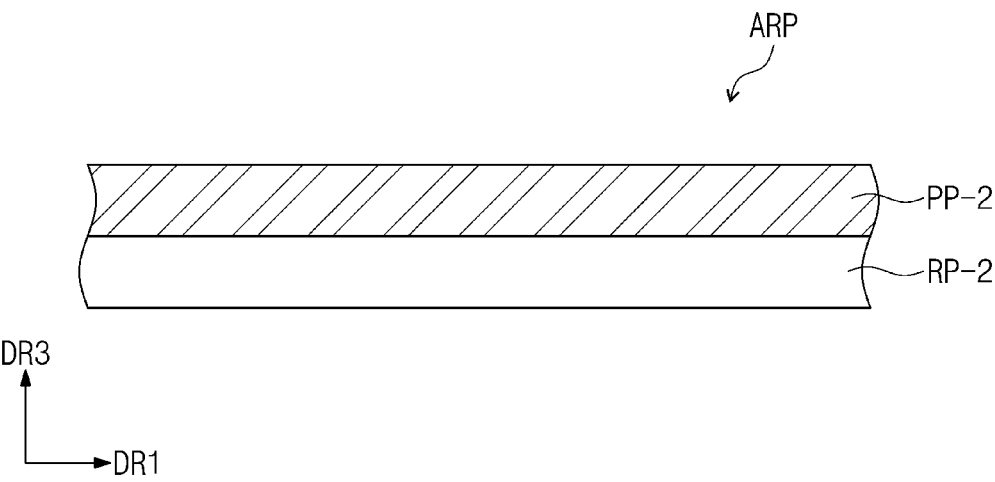
FIG. 18 is a schematic cross-sectional view of a light control layer according to an embodiment.

In the electronic device of an embodiment, the light control layer ARP arranged or disposed on the display panel DP may be a polarizing plate. For example, the electronic device of an embodiment may include an upper polarizing plate as the light control layer ARP. FIG. 18 is a schematic cross-sectional view of an example of a light control layer. Referring to FIG. 18, the light control layer ARP may include a second linear polarizing layer PP-2 and second phase retardation layer RP-2 as an upper polarizing plate. Referring to FIGS. 17 and 18, the second linear polarizing layer PP-2 may be arranged or disposed on the second phase retardation layer RP-2, and the second phase retardation layer RP-2 may be arranged or disposed between the display panel DP and the second linear polarizing layer PP-2.

The descriptions of the first linear polarizing layer PP-1 and the first phase retardation layer RP-1 provided or disposed above with reference to FIGS. 5 and 9 may also be applied to the second linear polarizing layer PP-2 and the second phase retardation layer RP-2. For example, the second polarizing layer PP-2 may be an optical layer that linearly polarizes provided light in one or a direction, and the second phase retardation layer RP-2 may be an optical layer that delays a phase of provided light. The second phase retardation layer RP-2 may include a $\lambda/4$ phase retarder.

Figure 19:
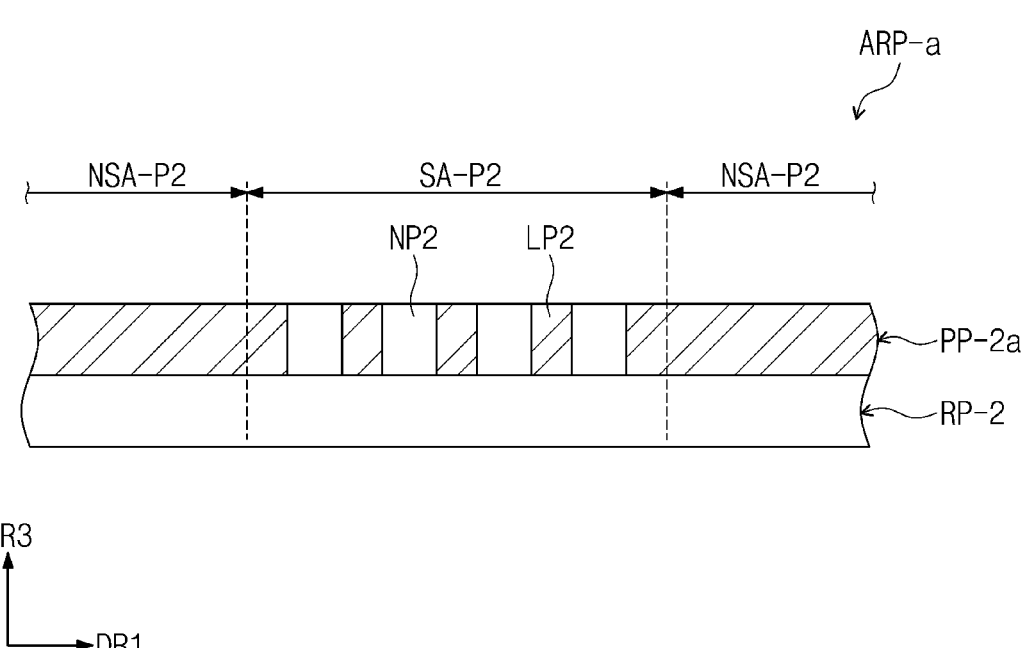
FIG. 19 is a schematic cross-sectional view of a light control layer according to an embodiment.

The light control layer including an upper polarizing plate according to an embodiment may be one including a non-polarizing portion, such as the lower polarizing plate PM-a described above with reference to FIGS. 6 to 8. FIG. 19 is a schematic cross-sectional view of a light control layer according to an embodiment.

Referring to FIG. 19, a light control layer ARP-a according to an embodiment may include a third polarizing region SA-P2 and a fourth polarizing region NSA-P2. In an embodiment, the third polarizing region SA-P2 may be a portion overlapping the first polarizing region SA-P (FIG. 7), and the fourth polarizing region NSA-P2 may be a portion overlapping the second polarizing region NSA-P. The third polarizing region SA-P2 may be a portion overlapping the electronic module EM (FIG. 2) and corresponding to the sensing region SA-DD (FIG. 1) of the electronic device. The fourth polarizing region NSA-P2 may surround at least a portion of the third polarizing region SA-P2.

In an embodiment, the third polarizing region SA-P2 and the fourth polarizing region NSA-P2 may have different average transmittances. The average light transmittance in the third polarizing region SA-P2 may be higher than the average light transmittance in the fourth polarizing region NSA-P2.

The third polarizing region SA-P2 may include a second polarizing portion LP2 and a second non-polarizing portion NP2. In an embodiment, a second linear polarizing layer PP-2a may include the second polarizing portion LP2 and the second non-polarizing portion NP2.

The light control layer ARP-a according to an embodiment may include the second linear polarizing layer PP-2a including the third polarizing region SA-P2 and the fourth polarizing region NSA-P2 and the second phase retardation layer RP-2 arranged or disposed on the second linear polarizing layer PP-2a. In the third polarizing region SA-P2, the second linear polarizing layer PP-2a may include the second non-polarizing portion NP2.

As in the lower polarizing plate PM-a described above with reference to FIGS. 6 to 8, the second non-polarizing portion NP2 may be a portion of a polymer film of the second linear polarizing layer PP-2a in which a light absorber may be desorbed or a portion of the polymer film of the second linear polarizing layer PP-2a in which only a small amount of the light absorber may be adsorbed.

In the case where a lower polarizing plate has the structure of the lower polarizing plate PM-a illustrated in FIG. 7, the light control layer may have the structure of the upper polarizing plate illustrated in FIG. 18 or the structure of the upper polarizing plate illustrated in FIG. 19.

In the case where the lower polarizing plate has the structure of the lower polarizing plate PM-a illustrated in FIG. 7 and the light control layer has the structure of the upper polarizing plate illustrated in FIG. 19, the first non-polarizing portion NP1 and the second non-polarizing portion NP2 may correspond to and overlap each other. However, an embodiment is not limited thereto.

Figure 20:
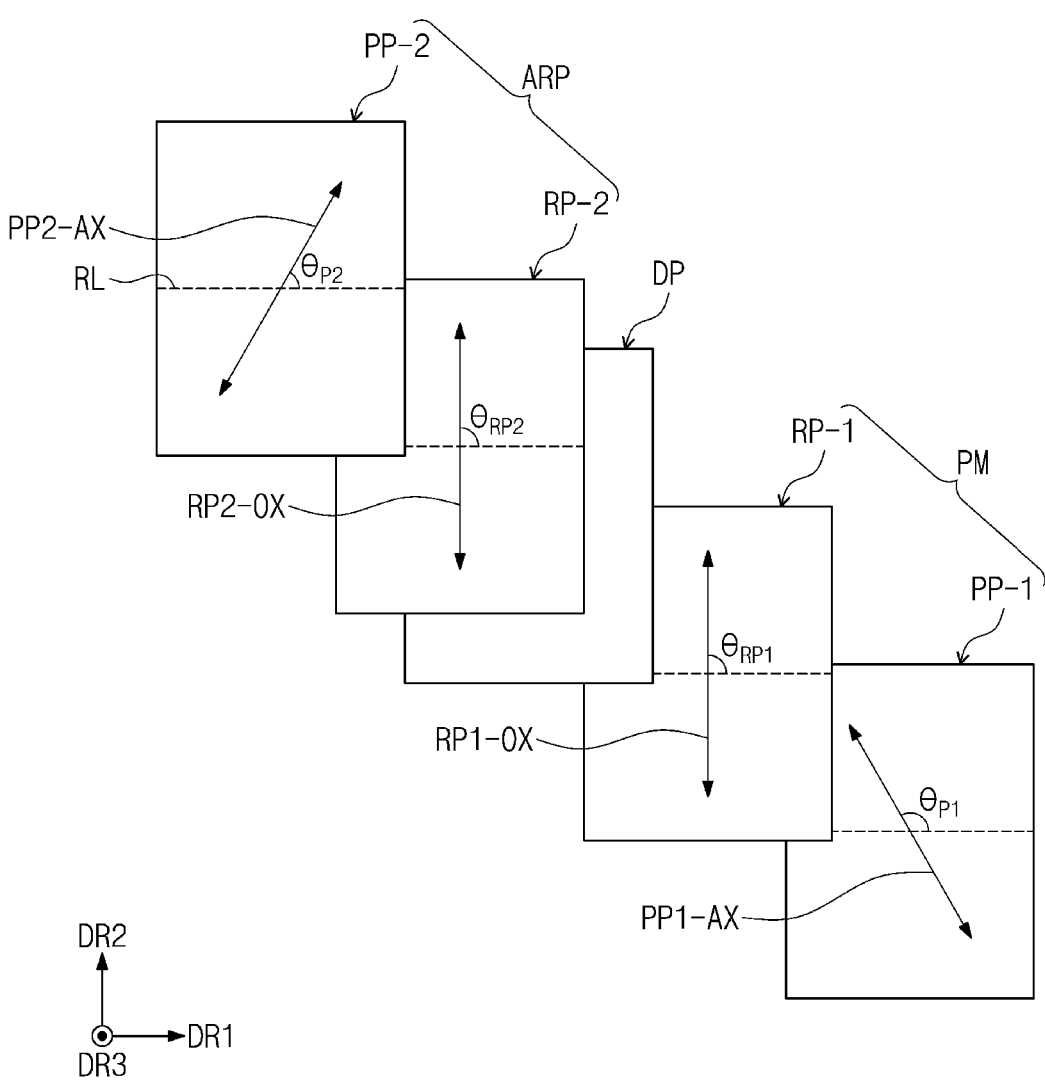
FIG. 20 is a diagram illustrating an optical axis relationship in an electronic device according to an embodiment.

FIG. 20 is a diagram schematically illustrating an optical axis relationship between optical layers included in a lower polarizing plate and light control layer in an electronic device according to an embodiment. FIG. 20 illustrates the optical axis relationship in the case where the electronic device of an embodiment may include the light control layer ARP having the configuration of the upper polarizing plate illustrated in FIG. 18 and may include the lower polarizing plate PM illustrated in FIGS. 5 and 9.

The first phase retardation layer RP-1 and the first linear polarizing layer PP-1 may be sequentially arranged or disposed in a downward direction from the display panel DP, and the second phase retardation layer RP-2 and the second linear polarizing layer PP-2 may be sequentially arranged or disposed in an upward direction from the display panel DP. Each of the first phase retardation layer RP-1 and the second phase retardation layer RP-2 may be a $\lambda/4$ phase retarder.

In an embodiment, the light control layer ARP may include the second linear polarizing layer PP-2 having an absorption axis PP2-AX that has an angle of $\theta_{P2}$ with respect to the reference line RL and the second phase retardation layer RP-2 arranged or disposed under or below the second linear polarizing layer PP-2 and having an optical axis RP2-OX that has an angle of $\theta_{RP2}$ with respect to the reference line RL. An angle between the absorption axis PP2-AX of the second linear polarizing layer and the optical axis RP2-OX of the second phase retardation layer may correspond to a difference between the angle $\theta_{RP2}$ and the angle $\theta_{P2}$, and the angle between the absorption axis PP2-AX of the second linear polarizing layer and the optical axis RP2-OX of the second phase retardation layer may be about 45±5 degrees.

The optical axis relationship between the second linear polarizing layer PP-2 and the second phase retardation layer RP-2 described above with reference to FIG. 20 may also be applied to an embodiment of the light control layer ARP-a described with reference to FIG. 19.

In an embodiment, the lower polarizing plate PM may include the first linear polarizing layer PP-1 having an absorption axis PP1-AX that has an angle of $\theta_{P1}$ with respect to the reference line RL and the first phase retardation layer RP-1 arranged or disposed on the first linear polarizing layer PP-1 and having an optical axis RP1-OX that has an angle of $\theta_{RP1}$ with respect to the reference line RL. An angle between the absorption axis of the first linear polarizing layer and the optical axis of the first phase retardation layer may correspond to a difference between the angle $\theta_{RP1}$ and the angle $\theta_{P1}$, and the angle between the absorption axis of the first linear polarizing layer and the optical axis of the first phase retardation layer may be about 45±5 degrees.

In an embodiment, light provided to the light control layer ARP from above the light control layer ARP and transmitted sequentially through the second linear polarizing layer PP-2 and the second phase retardation layer RP-2 may be counterclockwise polarized light, and light provided after being transmitted sequentially through the first linear polarizing layer PP-1 and the first phase retardation layer RP-1 of the lower polarizing plate PM may also be counterclockwise polarized light.

As an example, in an embodiment, light provided after being transmitted sequentially through the second linear polarizing layer PP-2 and the second phase retardation layer RP-2 of the light control layer ARP may be clockwise polarized light, and light provided after being transmitted sequentially through the first linear polarizing layer PP-1 and the first phase retardation layer RP-1 of the lower polarizing plate PM may also be clockwise polarized light.

For example, in the electronic device of an embodiment, in the case where the light control layer ARP is provided as an upper polarizing plate, both the upper polarizing plate and the lower polarizing plate PM may counterclockwise polarize provided light to transmit the light, or both the upper polarizing plate and the lower polarizing plate PM may clockwise polarize provided light to transmit the light. Accordingly, in the electronic device of an embodiment, an external optical signal may be transmitted through a portion corresponding to the non-pixel unit AR2 (FIG. 17) and provided to the electronic module EM (FIG. 2), and an optical signal emitted from the electronic module EM (FIG. 2) may be transferred externally. Each of FIGS. 21 and FIG.

Figure 21:
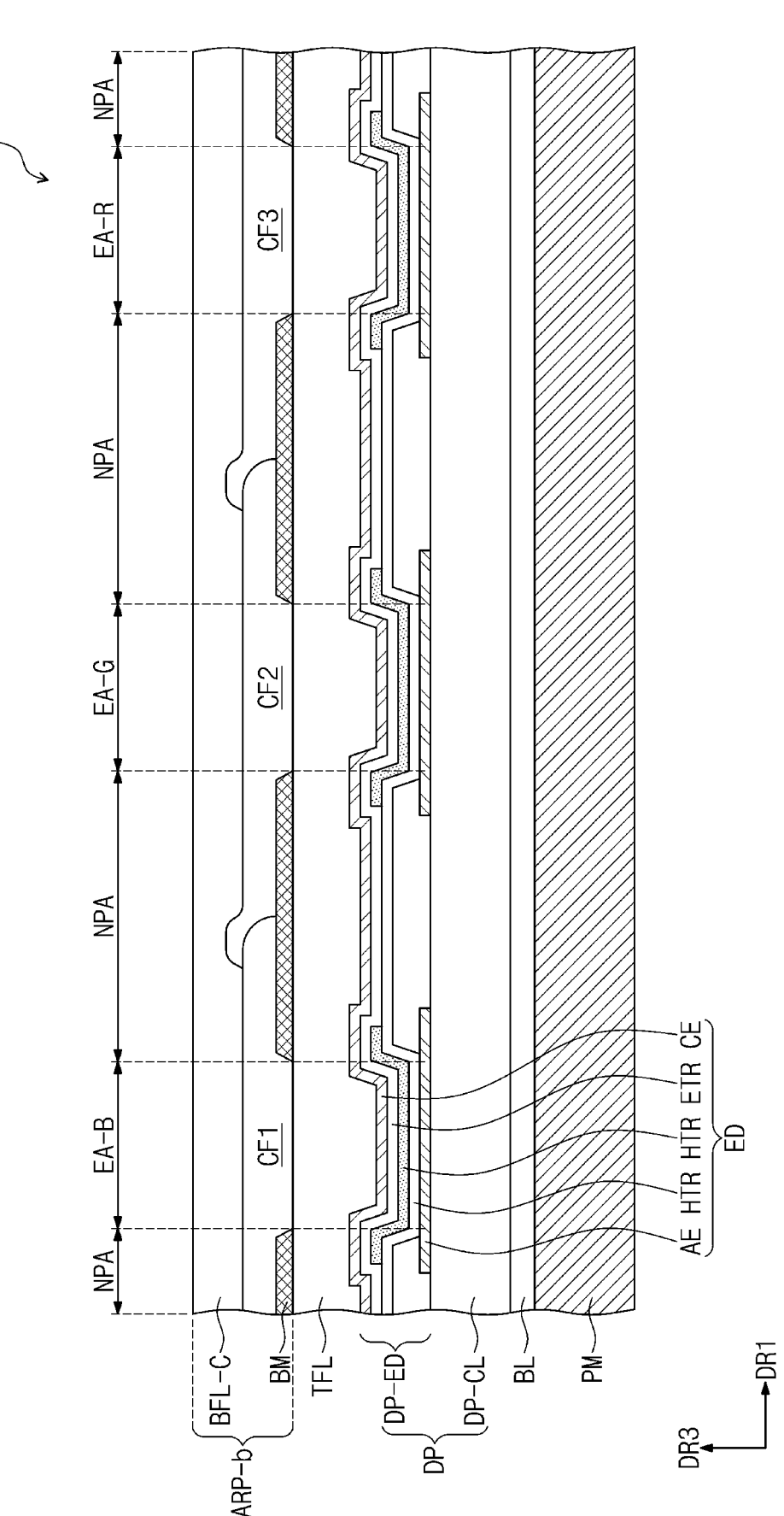
FIG. 21 is a schematic cross-sectional view of an electronic device of an embodiment.
Figure 22:
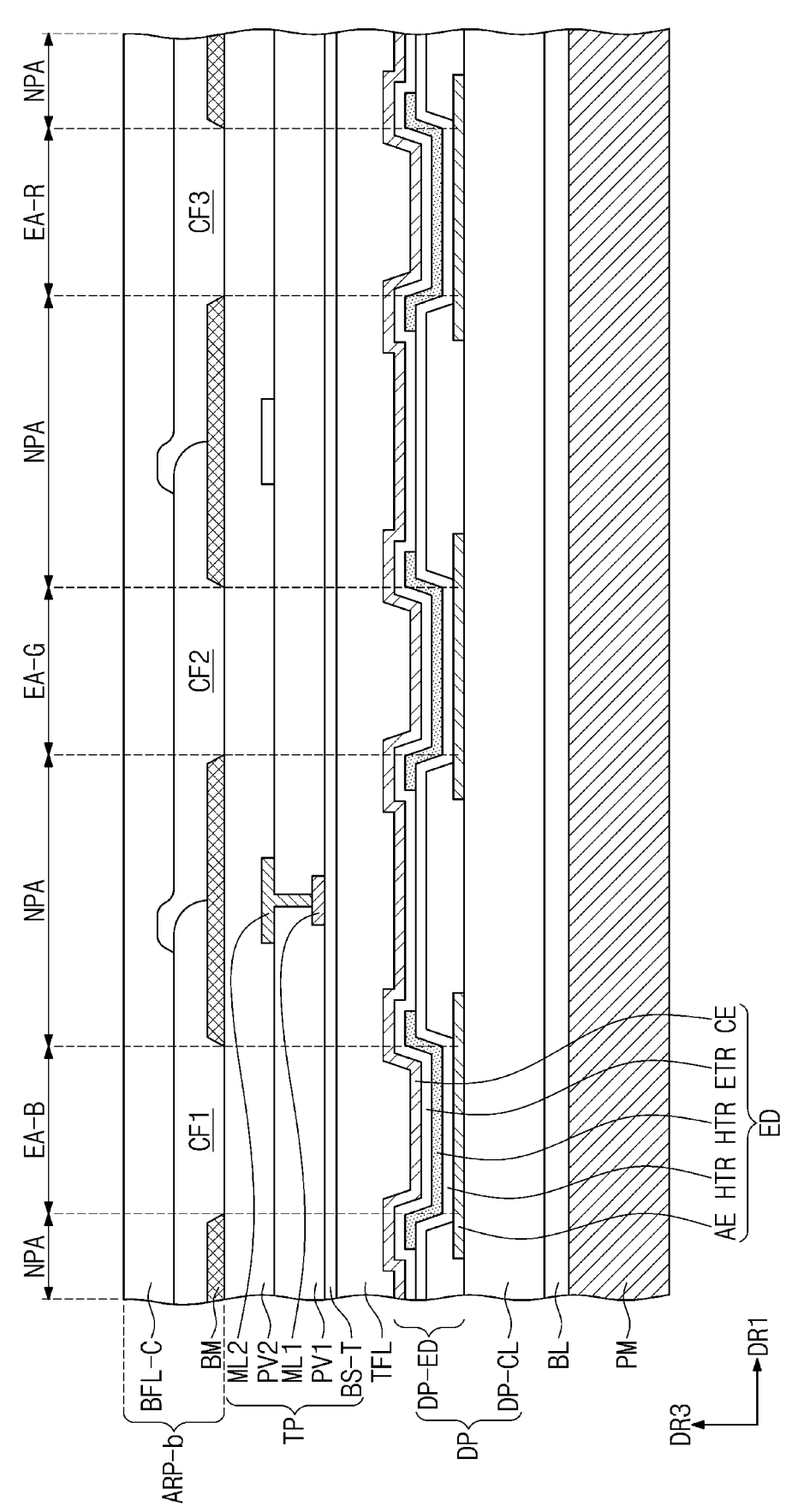
FIG. 22 is a schematic cross-sectional view of an electronic device of an embodiment.

22 is a schematic cross-sectional view of a portion of a second display region in an electronic device according to an embodiment. FIGS. 21 and 22 illustrate electronic devices including a color filter layer as a light control layer according to an embodiment. Referring to FIGS. 21 and 22, electronic devices DD-a, DD-1*a* of an embodiment may include the lower polarizing plate PM, the display panel DP arranged or disposed on the lower polarizing plate PM, and a light control layer ARP-b arranged or disposed on the display panel DP, as illustrated in FIG. 17.

The lower polarizing plate PM may have the lamination structure of the linear polarizing layer and the phase retardation layer illustrated in FIG. 5 or the lamination structure of the linear polarizing layer and the phase retardation layer illustrated in FIG. 7.

The display panel DP of an embodiment may include three light-emitting regions EA-B, EA-G, and EA-R, and non-light emitting regions NPA may be arranged or disposed between neighboring light-emitting regions EA-B, EA-G, and EA-R. In an embodiment, the first light-emitting region EA-B may emit blue light, the second light-emitting region EA-G may emit green light, and the third light-emitting region EA-R may emit red light. However, an embodiment is not limited thereto, and the blue light, green light, and red light may be changed to three other primary color lights.

The display panel DP may include the base layer BL, and the circuit layer DP-CL and the light-emitting element layer DP-ED arranged or disposed on the base layer BL. The descriptions of the base layer BL, the circuit layer DP-CL, and the light-emitting element layer DP-ED provided above with reference to FIG. 17 may be applied here.

FIG. 22 illustrates a portion of the electronic device DD-1*a* which may include the sensor layer TP unlike the electronic devices illustrated in FIGS. 21 and 17. The sensor layer TP may include a base layer BS-T, a first conductive layer ML1, a sensing insulating layer PV1, a second conductive layer ML2, and a cover insulating layer PV2.

The base layer BS-T may be an inorganic layer including at least one of silicon nitride, silicon oxynitride, or silicon oxide. As an example, the base layer BS-T may be an organic layer including epoxy resin, acryl resin, or imide-based resin. The base layer BS-T may have a single-layer structure, or may have a multi-layer structure laminated in the direction of the third direction axis DR3. In an embodiment, the base layer BS-T may be omitted.

Each of the first conductive layer ML1 and the second conductive layer ML2 may have a single-layer structure, or may have a multi-layer structure laminated in the direction of the third direction axis DR3.

A conductive layer having a single-layer structure may include a metal layer or a transparent conductive layer. The metal layer may include molybdenum (Mo), silver (Ag), titanium (Ti), copper (Cu), aluminum (Al), or an alloy thereof. The transparent conductive layer may include a transparent conductive oxide such as indium tin oxide (ITO), indium zinc oxide (IZO), zinc oxide (ZnO), and indium tin zinc oxide (ITZO). For example, the transparent conductive layer may include a conductive polymer such as PEDOT, metal nanowire, graphene, or the like within the spirit and the scope of the disclosure.

A conductive layer having a multi-layer structure may include metal layers. The metal layers may have, for example, a triple-layer structure of titanium/aluminum/titanium. The conductive layer having a multi-layer structure may include at least one metal layer and at least one transparent conductive layer.

The sensor layer TP may obtain information about an external input on the basis of a change in a mutual capacitance or self capacitance. For example, the sensor layer TP may include sensing patterns and bridge patterns. At least a portion of the sensing patterns and bridge patterns may be included in the first conductive layer ML1, and at least another portion of the sensing patterns and bridge patterns may be included in the second conductive layer ML2.

At least one of the sensing insulating layer PV1 or the cover insulating layer PV2 may include an inorganic layer. The inorganic layer may include at least one of aluminum oxide, titanium oxide, silicon oxide, silicon nitride, silicon oxynitride, zirconium oxide, or hafnium oxide.

At least one of the sensing insulating layer PV1 or the cover insulating layer PV2 may include an organic layer. The organic layer may include at least one of acrylic resin, methacrylic resin, polyisoprene, vinyl-based resin, epoxy-based resin, urethane-based resin, cellulosic resin, siloxane-based resin, polyimide-based resin, polyamide-based resin, or perylene-based resin.

The light control layer ARP-b according to an embodiment may include a light-shielding portion BM and filter portions CF1, CF2, and CF3. The light control layer ARP-b may include a first filter portion CF1 for transmitting blue light, a second filter portion CF2 for transmitting green light, and a third filter portion CF3 for transmitting red light.

Each of the filter portions CF1, CF2, and CF3 may include a polymer photosensitive resin and pigment or dye. The first filter portion CF1 may include a blue pigment or dye, the second filter portion CF2 may include a green pigment or dye, and the third filter portion CF3 may include a red pigment or dye. However, an embodiment is not limited thereto, and the first filter portion CF1 may not include a pigment or dye. The first filter portion CF1 may include a polymer photosensitive resin but may not include a pigment or dye. The first filter portion CF1 may be transparent. The first filter portion CF1 may be formed of a transparent photosensitive resin.

Furthermore, in an embodiment, the second filter portion CF2 and the third filter portion CF3 may be yellow filters. The second filter portion CF2 and the third filter portion CF3 may be provided as one body without being separated from each other.

The first to third filter portions CF1, CF2, and CF3 may be arranged or disposed in correspondence with the first light-emitting region EA-B for example, a blue light-emitting region, the second light-emitting region EA-G for example, a green light-emitting region, and the third light-emitting region EA-R for example, a red light-emitting region.

The light-shielding portion BM may be a black matrix. The light-shielding portion BM may include an organic light-shielding material or inorganic light-shielding material including a black pigment or black dye. The light-shielding portion BM may prevent a light leakage phenomenon and may define boundaries between neighboring filter portions CF1, CF2, and CF3. Furthermore, in an embodiment, the light-shielding portion BM may be formed of a blue light filter.

In an embodiment, the first filter portion CF1 may be arranged or disposed overlapping the light-shielding portion BM. The first filter portion CF1 may also be provided to the first light-emitting region EA-B and a portion overlapping the light-shielding portion BM between neighboring light-emitting regions.

The light control layer ARP-b may include a capping layer BFL-C. The capping layer BFL-C may include at least one inorganic layer. For example, the capping layer BFL-C may be formed of an inorganic material. For example, the capping layer BFL-C may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, or a metal thin-film having a secured light transmittance. The capping layer BFL-C may further include an organic layer. The capping layer BFL-C may be configured as a single layer or multi-layer. In an embodiment, the capping layer BFL-C may be omitted.

Furthermore, unlike the illustration, the light control layer ARP-b may further include an upper base substrate (not shown) in an embodiment. The upper base substrate (not shown) may be a member that provides a base surface on which the filter portions CF1, CF2, and CF3 may be arranged or disposed. The upper base substrate (not shown) may be a glass substrate, a metal substrate, a plastic substrate, or the like within the spirit and the scope of the disclosure. However, an embodiment is not limited thereto, and, thus, the upper base substrate (not shown) may be an inorganic layer, an organic layer, or a composite material layer. The capping layer BFL-C further including the upper base substrate (not shown) may be omitted.

The light control layer ARP-b that may be a color filter layer may be arranged or disposed on the upper insulating layer TFL in the electronic device DD-a illustrated in FIG. 21. Furthermore, the light control layer ARP-b that may be a color filter layer may be arranged or disposed on the cover insulating layer PV2 in the electronic device DD-1a illustrated in FIG. 22.

Figure 23:
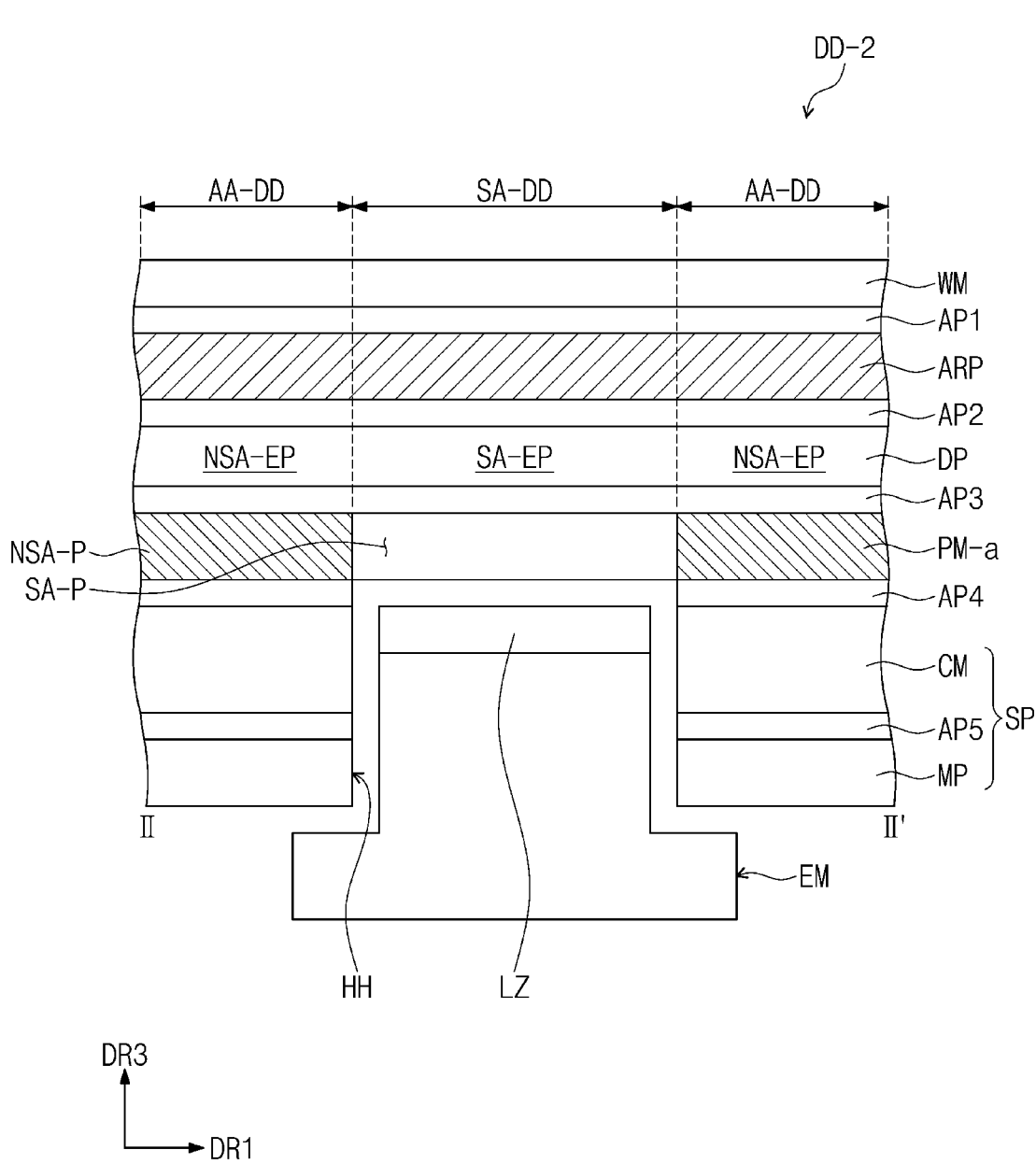
FIG. 23 is a schematic cross-sectional view of an electronic device of an embodiment.
Figure 24:
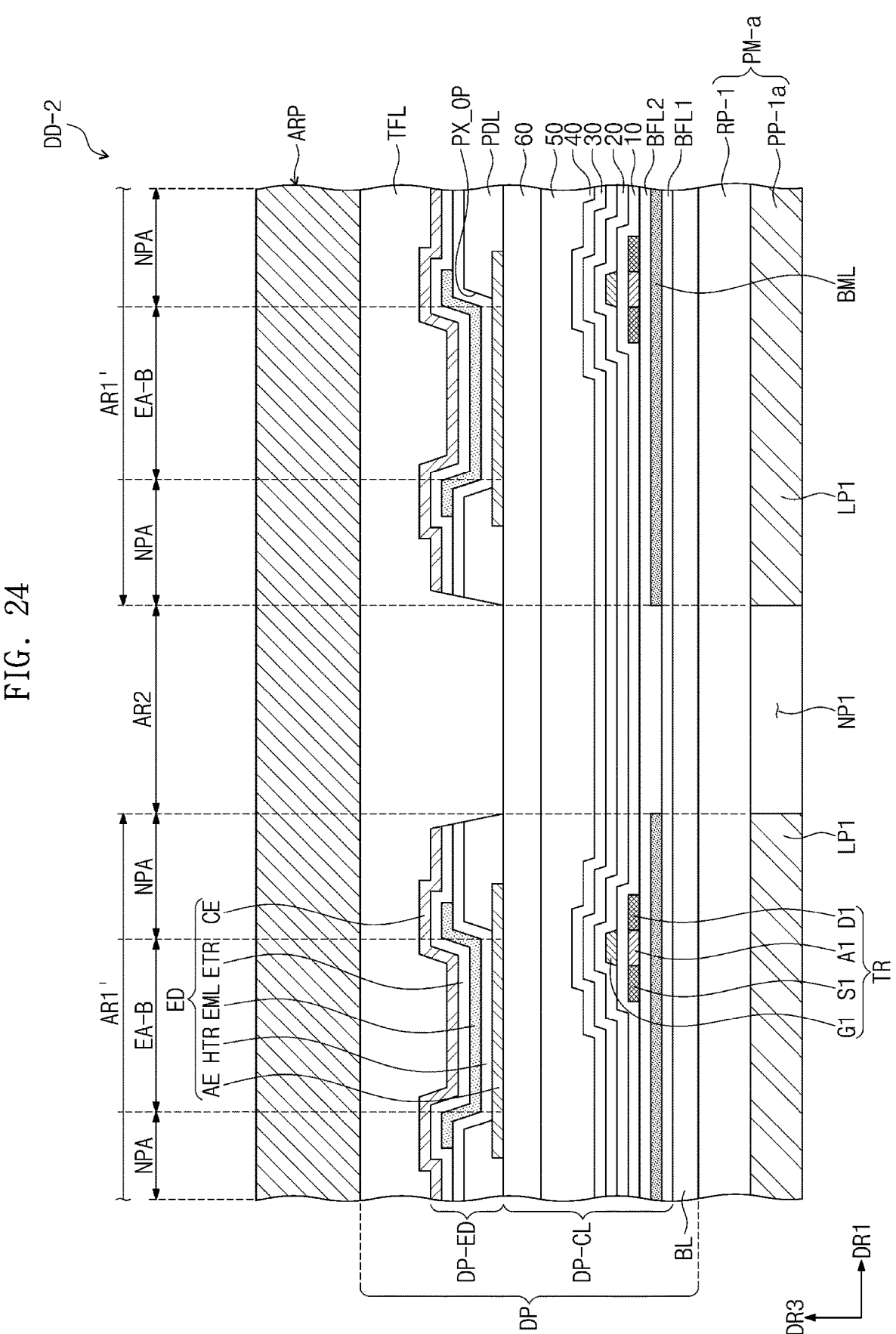
FIG. 24 is a schematic cross-sectional view of an electronic device of an embodiment.

FIG. 23 is a schematic cross-sectional view of a portion of an electronic device of an embodiment. FIG. 24 is a schematic cross-sectional view of a portion of a first display region of an electronic device according to an embodiment. FIG. 24 may illustrate a portion of the sensing region SA-DD of FIG. 23.

Referring to FIGS. 23 and 24, an electronic device DD-2 of an embodiment may include the display panel DP, the light control layer ARP arranged or disposed on the display panel DP, and the lower polarizing plate PM-a arranged or disposed under or below the display panel DP. The electronic module EM may be arranged or disposed under or below the lower polarizing plate PM-a. The support member SP in which the through-hole HH may be defined may be arranged or disposed under or below the lower polarizing plate PM-a, and at least a portion of the electronic module EM may overlap the through-hole HH.

The descriptions provided above with reference to FIGS. 4 to 17 may also be applied to the display panel DP, the support member SP, and the electronic module EM of the electronic device DD-2 illustrated in FIGS. 23 and 24. However, referring to FIG. 23, the shielding pattern BML included in the circuit layer DP-CL may overlap an entirety of the second pixel unit AR1' in an embodiment, unlike the illustration of FIG. 17.

In the electronic device DD-2 of an embodiment, the lower polarizing plate PM-a may include the first polarizing region SA-P overlapping the first display region SA-EP and the second polarizing region NSA-P overlapping the second display region NSA-EP. The lower polarizing plate PM-a may include the first non-polarizing portion NP1 and the first polarizing portion LP1.

In an embodiment, the first non-polarizing portion NP1 may not overlap the shielding pattern BML. Furthermore, the first polarizing portion LP1 may overlap the shielding pattern BML. Furthermore, although not illustrated, the second polarizing region NSA-P of the lower polarizing plate PM-a arranged or disposed in correspondence with the second display region NSA-EP may overlap an entirety of the circuit layer DP-CL.

The lower polarizing plate PM-a having the first non-polarizing portion NP1 and the first polarizing portion LP1 according to an embodiment may be formed through a patterning process using an opaque layer included in the circuit layer DP-CL as a mask. For example, the shielding pattern BML included in the circuit layer DP-CL may be used as a mask to form the lower polarizing plate PM-a having the first non-polarizing portion NP1. The lower polarizing plate may be arranged or disposed under or below the circuit layer DP-CL having the shielding pattern BML and laser light may be radiated from above the circuit layer DP-CL so as to be transmitted through the circuit layer DP-CL and incident onto the lower polarizing plate, so that the laser light may be transferred to a portion of the lower polarizing plate which may not overlap the shielding pattern BML. Here, due to the provided laser light, the first non-polarizing portion NP1 may be formed or disposed in the portion which may not overlap the shielding pattern BML.

For example, the light absorber included in the first linear polarizing layer PP-1 a is not desorbed in the portion overlapping the shielding pattern BML that serves as a mask since the portion overlapping the shielding pattern BML is not irradiated with the laser light, and the portion which does not overlap the shielding pattern BML is irradiated with the laser light so that the light absorber included in the first linear polarizing layer PP-1a is desorbed, thus forming the first non-polarizing portion NP1.

In the electronic device DD-2 of an embodiment, the light control layer ARP may be an upper polarizing plate or a color filter layer. In the case where the light control layer ARP may be an upper polarizing plate in the electronic device DD-2 of an embodiment, the light control layer ARP may have the structure of the light control layer illustrated in FIG. 18 or 19. In the case where the electronic device DD-2 has the structure of the upper polarizing plate illustrated in FIG. 19, the light control layer may include the third polarizing region SA-P2 (FIG. 19) overlapping the first polarizing region SA-P and the fourth polarizing region NSA-P2 (FIG. 19) overlapping the second polarizing region NSA-P. Hereinafter, an electronic device according to an embodiment will be described with reference to FIGS. 25 to 33. The descriptions of the electronic device according to an embodiment provided below with reference to FIGS. 25 to 33 are focused on differences with the above descriptions provided with reference to FIGS. 1 to 24, and overlapping descriptions may not be provided.

Figure 25:
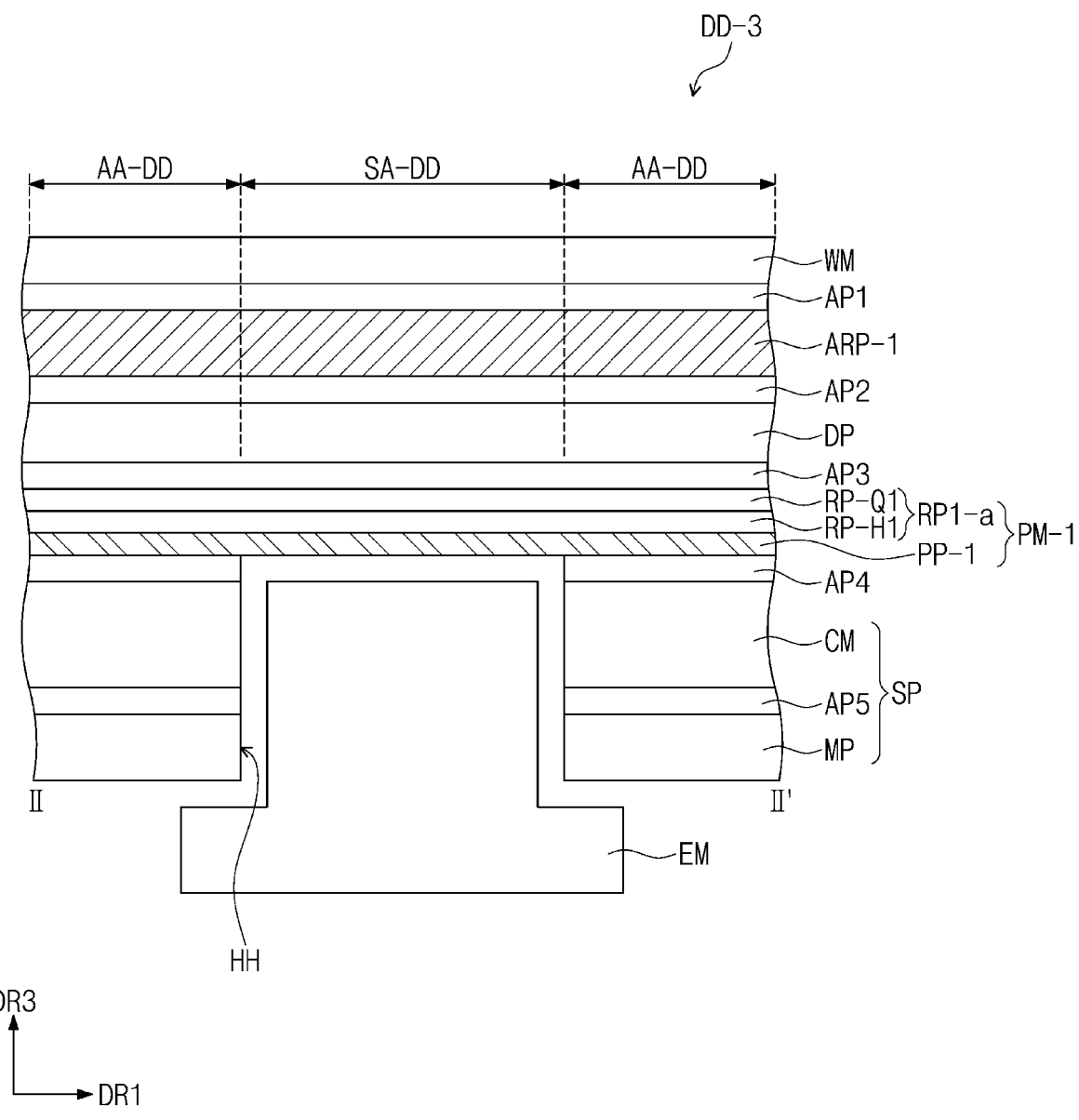
FIG. 25 is a schematic cross-sectional view of an electronic device of an embodiment.

FIG. 25 is a schematic cross-sectional view of an electronic device of an embodiment. An electronic device DD-3 according to an embodiment illustrated in FIG. 25 is different from the electronic device DD described with reference to FIG. 4 with respect to the configuration of a lower polarizing plate PM-1.

The lower polarizing plate PM-1 included in the electronic device DD-3 according to an embodiment may include the first linear polarizing layer PP-1 and a first phase retardation layer RP1-a arranged or disposed on the first linear polarizing layer PP-1, wherein the first phase retardation layer RP1-a may include a first λ/4 phase retarder RP-Q1 and a first λ/2 phase retarder RP-H1. The first λ/2 phase retarder RP-H1 may be arranged or disposed between the first linear polarizing layer PP-1 and the first λ/4 phase retarder RP-Q1.

The electronic device DD-3 of an embodiment may include the lower polarizing plate PM-1 including the first linear polarizing layer PP-1, the first $\lambda/2$ phase retarder RP-H1, and the first $\lambda/4$ phase retarder RP-Q1, which may be sequentially stacked each other in a direction from the electronic module EM to the display panel DP.

The first $\lambda/2$ phase retarder RP-H1 and the first $\lambda/4$ phase retarder RP-Q1 may be the same type of stretched film as the first phase retardation layer described above with reference to FIG. 5. The $\lambda/2$ phase retarder and $\lambda/4$ phase retarder described herein may be formed by biaxially stretching a film or may be provided in a form of a liquid crystal coating layer but the disclosure is not limited thereto.

Figure 26:
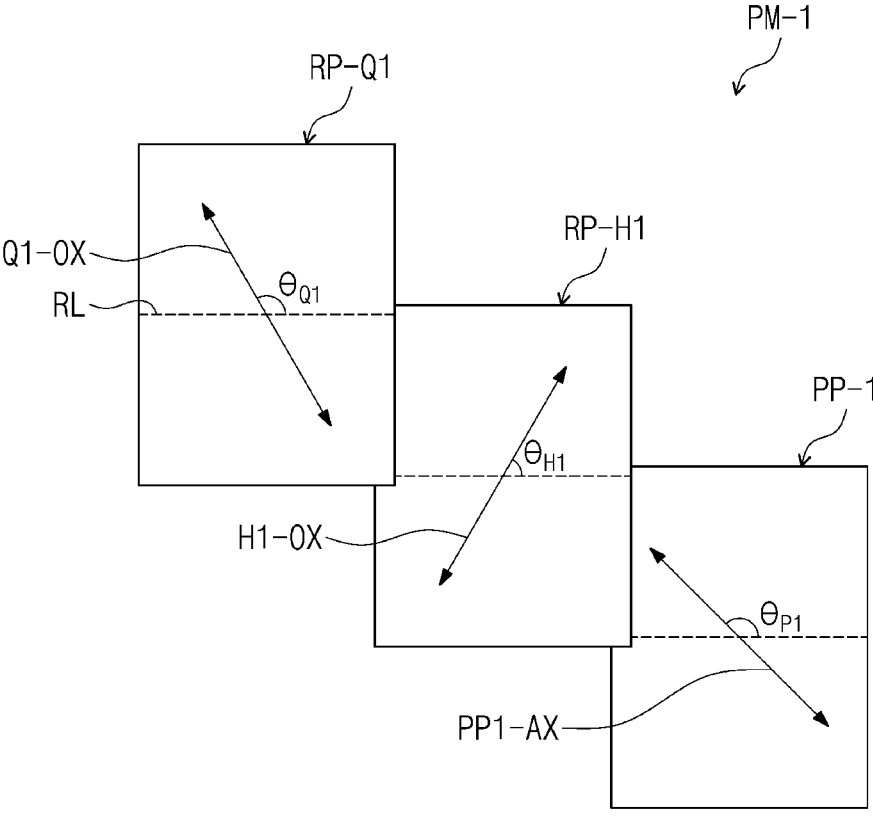
FIG. 26 is a diagram illustrating optical axes in a lower polarizing plate according to an embodiment.
Figure 26:
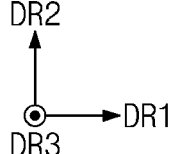
Figure 27:
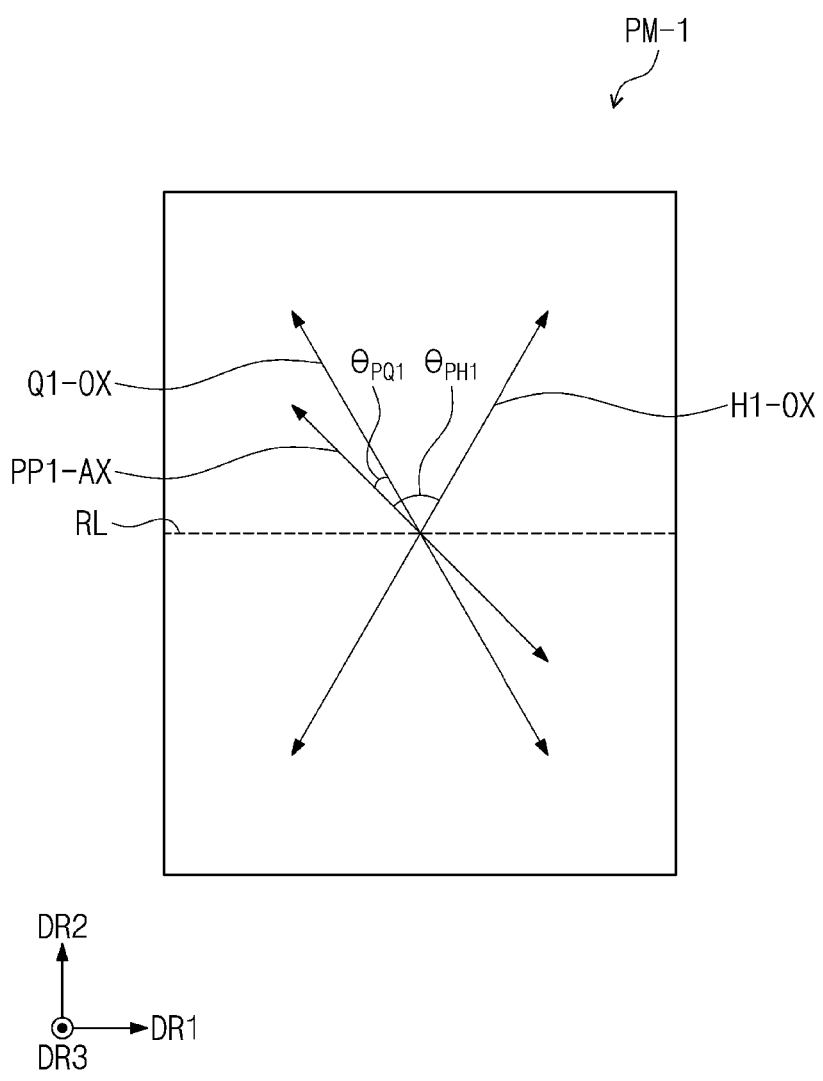
FIG. 27 is a diagram illustrating an optical axis relationship in a lower polarizing plate according to an embodiment.
Figure 28:
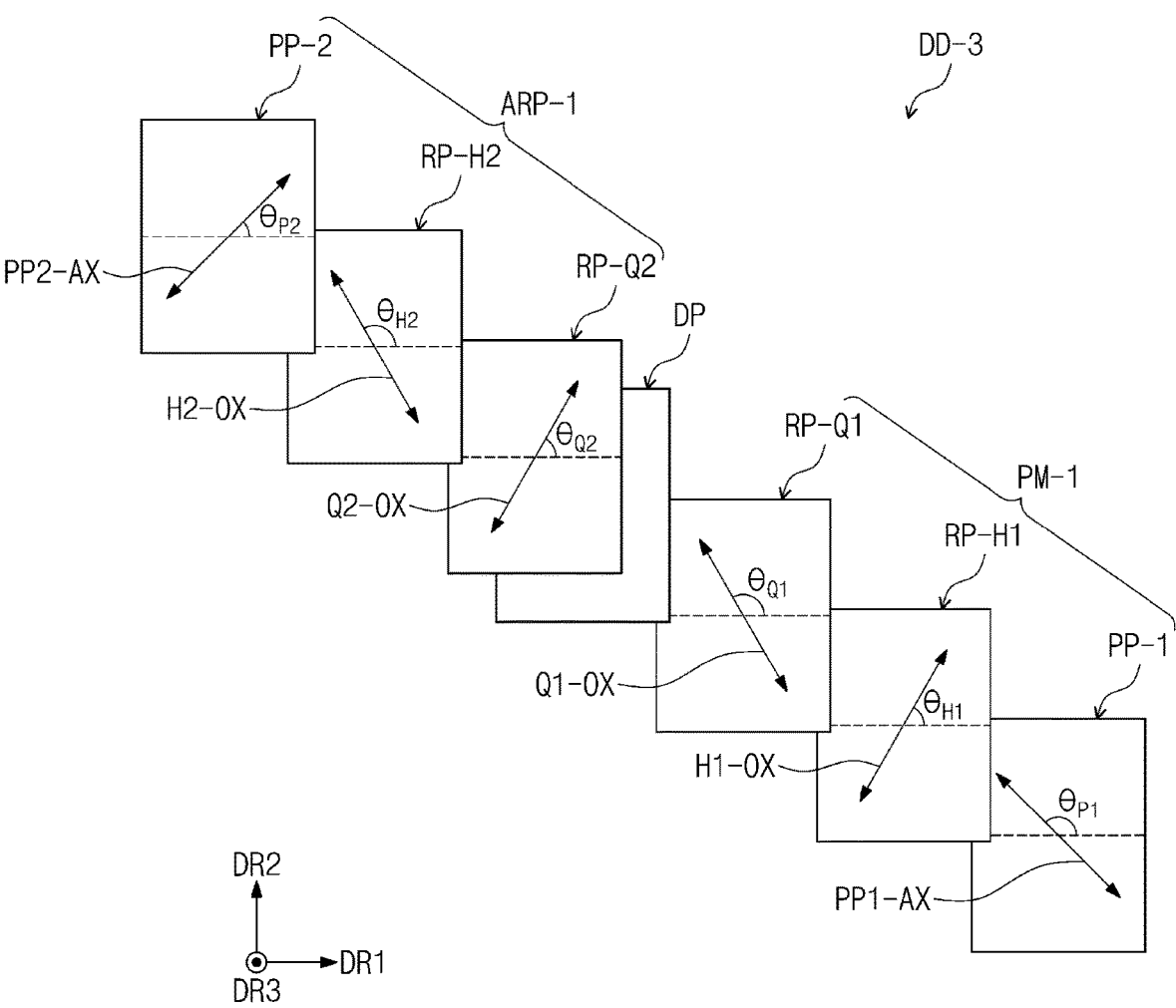
FIG. 28 is a diagram illustrating an optical axis relationship in an electronic device according to an embodiment.

FIG. 26 is a diagram schematically illustrating optical axes in a lower polarizing plate according to an embodiment, and FIG. 27 is a diagram schematically illustrating a relationship between optical axes in a lower polarizing plate according to an embodiment. FIG. 28 is a diagram illustrating an optical axis relationship in an electronic device of an embodiment.

Referring to FIGS. 26 to 28, in an embodiment, an angle $\theta_{PQ1}$ between the absorption axis PP1-AX of the first linear polarizing layer PP-1 and an optical axis Q1-OX of the first $\lambda/4$ phase retarder RP-Q1 may be about 15±5 degrees, and an angle $\theta_{PH1}$ between the absorption axis PP1-AX of the first linear polarizing layer PP-1 and an optical axis H1-OX of the first $\lambda/2$ phase retarder RP-H1 may be about 75±5 degrees.

In an embodiment, when a condition that the angle $\theta_{PQ1}$ between the absorption axis PP1-AX of the first linear polarizing layer PP-1 and the optical axis Q1-OX of the first $\lambda/4$ phase retarder RP-Q1 be about 15±5 degrees, and the angle $\theta_{PH1}$ between the absorption axis PP1-AX of the first linear polarizing layer PP-1 and the optical axis H1-OX of the first $\lambda/2$ phase retarder RP-H1 be about 75±5 degrees is satisfied, an angle $\theta_{P1}$ of the absorption axis PP1-AX of the first linear polarizing layer PP-1 with respect to the reference line RL, an angle $\theta_{Q1}$ of the optical axis Q1-OX of the first $\lambda/4$ phase retarder RP-Q1 with respect to the reference line RL, and an angle $\theta_{H1}$ of the optical axis H1-OX of the first $\lambda/2$ phase retarder RP-H1 with respect to the reference line RL may be variously changed.

For example, in the lower polarizing plate PM-1 according to an embodiment, the angle $\theta_{P1}$ of the absorption axis PP1-AX of the first linear polarizing layer PP-1 may be about 135±5 degrees, the angle $\theta_{H1}$ of the optical axis H1-OX of the first $\lambda/2$ phase retarder RP-H1 may be about 60±5 degrees, and the angle $\theta_{Q1}$ of the optical axis Q1-OX of the first $\lambda/4$ phase retarder RP-Q1 may be about 120±5 degrees. However, an embodiment is not limited thereto.

In the electronic device DD-3 of an embodiment, a light control layer ARP-1 may be a color filter layer or an upper polarizing plate including at least one phase retardation layer and a linear polarizing layer.

The light control layer ARP-1 included in the electronic device of an embodiment may include the second linear polarizing layer PP-2, a second $\lambda/2$ phase retarder RP-H2, and a second $\lambda/4$ phase retarder RP-Q2. In an embodiment, the light control layer ARP-1 that may be an upper polarizing plate may include the second $\lambda/4$ phase retarder RP-Q2, the second $\lambda/2$ phase retarder RP-H2, and the second linear polarizing layer PP-2, which may be sequentially stacked each other in a direction away from the display panel DP.

In an embodiment, an angle (difference between $\theta_{P2}$ and $\theta_{Q2}$) between the absorption axis PP2-AX of the second linear polarizing layer PP-2 and an optical axis Q2-OX of the second $\lambda/4$ phase retarder RP-Q2 may be about 15±5 degrees, and an angle (difference between $\theta_{P2}$ and $\theta_{H2}$) between the absorption axis PP2-AX of the second linear polarizing layer PP-2 and an optical axis H2-OX of the second $\lambda/2$ phase retarder RP-H2 may be about 75±5 degrees.

In an embodiment, when a condition that the angle between the absorption axis PP2-AX of the second linear polarizing layer PP-2 and the optical axis Q2-OX of the second $\lambda/4$ phase retarder RP-Q2 be about 15±5 degrees, and the angle between the absorption axis PP2-AX of the second linear polarizing layer PP-2 and the optical axis H2-OX of the second $\lambda/2$ phase retarder RP-H2 be about 75±5 degrees is satisfied, an angle $\theta_{P2}$ of the absorption axis PP2-AX of the second linear polarizing layer PP-2 with respect to the reference line RL, an angle $\theta_{Q2}$ of the optical axis Q2-OX of the second $\lambda/4$ phase retarder RP-Q2 with respect to the reference line RL, and an angle $\theta_{H2}$ of the optical axis H2-OX of the second $\lambda/2$ phase retarder RP-H2 with respect to the reference line RL may be variously changed.

For example, in the upper polarizing plate that may be the light control layer ARP-1 according to an embodiment, the angle $\theta_{P2}$ of the absorption axis PP2-AX of the second linear polarizing layer PP-2 may be about 45±5 degrees, the angle $\theta_{H2}$ of the optical axis H2-OX of the second $\lambda/2$ phase retarder RP-H2 may be about 120±5 degrees, and the angle $\theta_{Q2}$ of the optical axis Q2-OX of the second $\lambda/4$ phase retarder RP-Q2 may be about 60±5 degrees. However, an embodiment is not limited thereto.

Although FIG. 28 illustrates the absorption axis PP1-AX of the first linear polarizing layer PP-1 and the absorption axis PP2-AX of the second linear polarizing layer PP-2 as intersecting each other, an embodiment is not limited thereto. For example, the absorption axis PP1-AX of the first linear polarizing layer PP-1 and the absorption axis PP2-AX of the second linear polarizing layer PP-2 are not limited to being perpendicular to each other.

In an embodiment, when the optical axes of the second linear polarizing layer PP-2, the second $\lambda/2$ phase retarder RP-H2, and the second $\lambda/4$ phase retarder RP-Q2 have the above-mentioned angle relationships in the upper polarizing plate, and the optical axes of the first linear polarizing layer PP-1, the first $\lambda/2$ phase retarder RP-H1, and the first $\lambda/4$ phase retarder RP-Q1 have the above-mentioned angle relationships in the lower polarizing plate PM-1, the direction of the absorption axis PP1-AX of the first linear polarizing layer PP-1 and the direction of the absorption axis PP2-AX of the second linear polarizing layer PP-2 may be independent of each other. For example, the absorption axis PP1-AX of the first linear polarizing layer PP-1 and the absorption axis PP2-AX of the second linear polarizing layer PP-2 may intersect in different directions or may be parallel to each other.

In the electronic device DD-3 according to an embodiment illustrated in FIG. 28, light provided to the light control layer ARP-1 and sequentially transmitted through the second linear polarizing layer PP-2, the second $\lambda/2$ phase retarder RP-H2, and the second $\lambda/4$ phase retarder RP-Q2 may be counterclockwise polarized light, and light provided after being sequentially transmitted through the first linear polarizing layer PP-1, the first $\lambda/2$ phase retarder RP-H1, and the first $\lambda/4$ phase retarder RP-Q1 of the lower polarizing plate PM-1 may also be counterclockwise polarized light.

Figure 29:
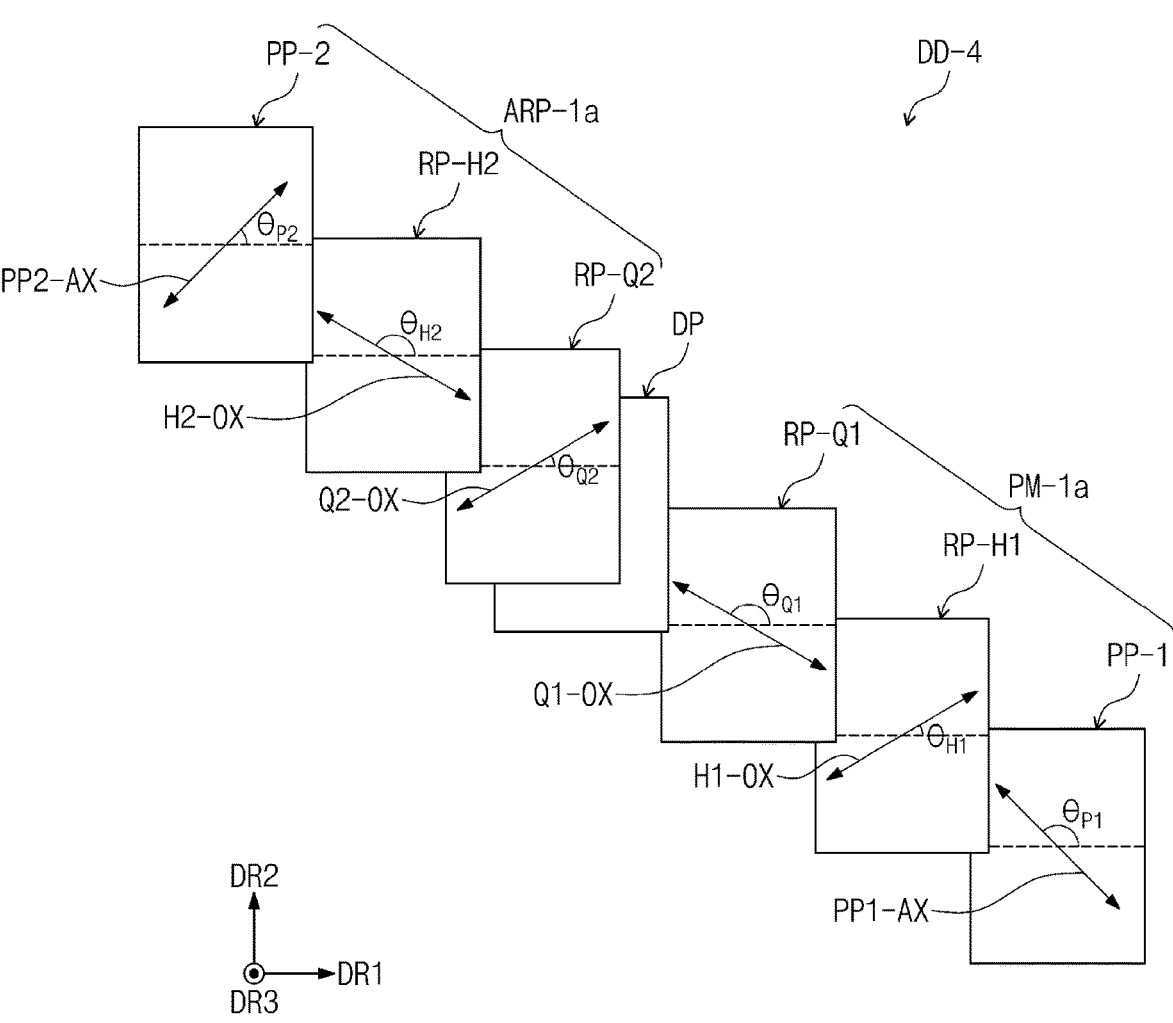
FIG. 29 is a diagram illustrating an optical axis relationship in an electronic device according to an embodiment.
Figure 30A:
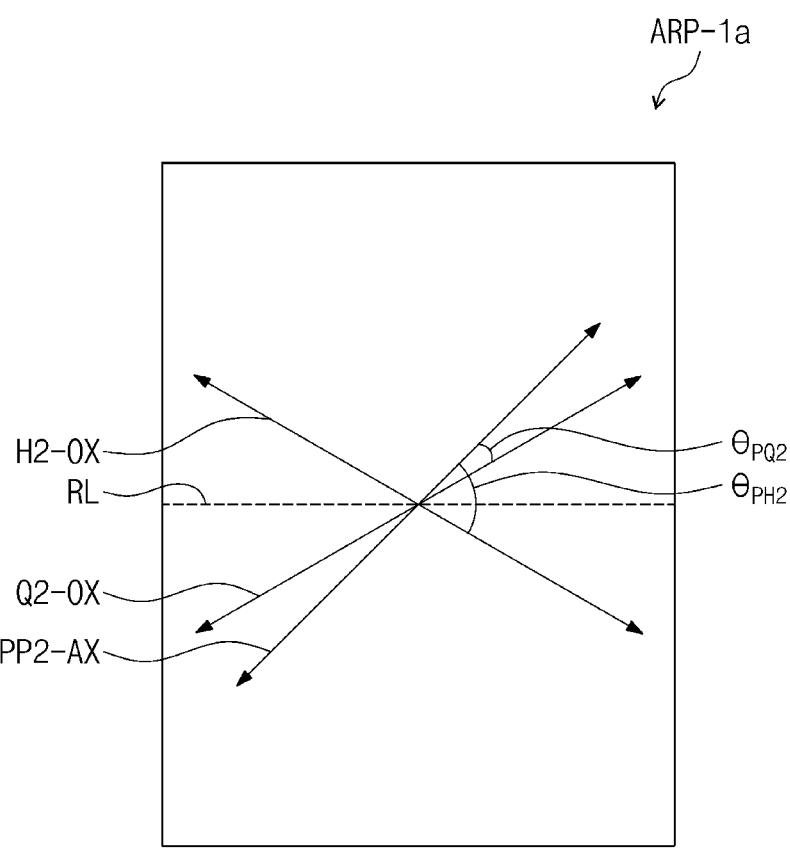
FIG. 30A is a diagram illustrating an optical axis relationship in a light control layer according to an embodiment.

FIG. 29 is a diagram illustrating optical axes in an electronic device DD-4 according to an embodiment. FIG. 30A is a diagram illustrating an optical axis relationship between optical layers in a light control layer, and FIG. 30B is a diagram illustrating an optical axis relationship between optical layers in a lower polarizing plate.

The electronic device DD-4 according to an embodiment illustrated in FIG. 29 may include an upper polarizing plate as a light control layer ARP-1a on the display panel DP and a lower polarizing plate PM-1a under or below the display panel DP. The light control layer ARP-1a that may be an upper polarizing plate may include the second $\lambda/4$ phase retarder RP-Q2, the second $\lambda/2$ phase retarder RP-H2, and the second linear polarizing layer PP-2, which may be sequentially stacked each other in a direction away from the display panel DP, and the lower polarizing plate PM-1a may include the first linear polarizing layer PP-1, the first $\lambda/2$ phase retarder RP-H1, and the first $\lambda/4$ phase retarder RP-Q1, which may be sequentially stacked each other in a direction to the display panel DP.

Figure 30B:
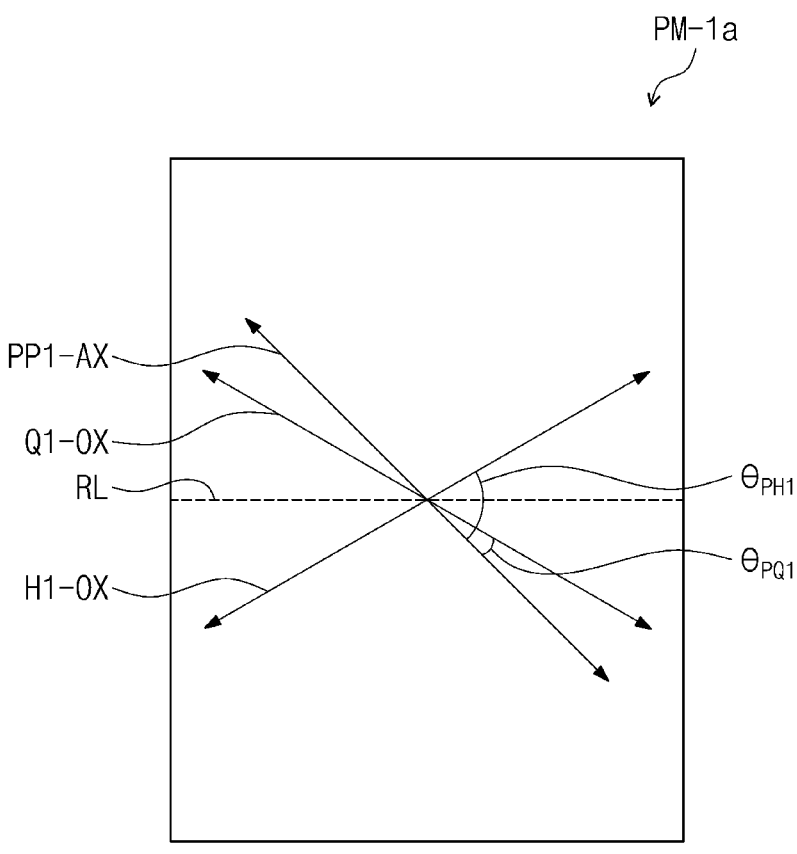
FIG. 30B is a diagram illustrating an optical axis relationship in a lower polarizing plate according to an embodiment.

Referring to FIGS. 29 to 30B, in an embodiment, an angle $\theta_{PQ2}$ between the absorption axis PP2-AX of the second linear polarizing layer PP-2 and the optical axis Q2-OX of the second $\lambda/4$ phase retarder RP-Q2 may be about 15±5 degrees, and an angle $\theta_{PH2}$ between the absorption axis PP2-AX of the second linear polarizing layer PP-2 and the optical axis H2-OX of the second $\lambda/2$ phase retarder RP-H2 may be about 75±5 degrees. Furthermore, an angle $\theta_{PQ1}$ between the absorption axis PP1-AX of the first linear polarizing layer PP-1 and the optical axis Q1-OX of the first $\lambda/4$ phase retarder RP-Q1 may be about 15±5 degrees, and an angle $\theta_{PH1}$ between the absorption axis PP1-AX of the first linear polarizing layer PP-1 and the optical axis H1-OX of the first $\lambda/2$ phase retarder RP-H1 may be about 75±5 degrees.

In an embodiment, when a condition that the angle $\theta_{PQ2}$ between the absorption axis PP2-AX of the second linear polarizing layer PP-2 and the optical axis Q2-OX of the second $\lambda/4$ phase retarder RP-Q2 be about 15±5 degrees, and the angle $\theta_{PH2}$ between the absorption axis PP2-AX of the second linear polarizing layer PP-2 and the optical axis H2-OX of the second $\lambda/2$ phase retarder RP-H2 be about 75±5 degrees is satisfied, the direction of the absorption axis PP2-AX of the second linear polarizing layer PP-2 may be variously changed. Furthermore, in an embodiment, when a condition that the angle $\theta_{PQ1}$ between the absorption axis PP1-AX of the first linear polarizing layer PP-1 and the optical axis Q1-OX of the first $\lambda/4$ phase retarder RP-Q1 be about 15±5 degrees, and the angle $\theta_{PH1}$ between the absorption axis PP1-AX of the first linear polarizing layer PP-1 and the optical axis H1-OX of the first $\lambda/2$ phase retarder RP-H1 be about 75±5 degrees is satisfied, the direction of the absorption axis PP1-AX of the first linear polarizing layer PP-1 may be variously changed.

For example, in the lower polarizing plate PM-1a according to an embodiment, the angle $\theta_{P1}$ of the absorption axis PP1-AX of the first linear polarizing layer PP-1 with respect to the reference line RL parallel to the first direction axis DR1 may be about 135±5 degrees, the angle $\theta_{H1}$ of the optical axis H1-OX of the first $\lambda/2$ phase retarder RP-H1 with respect to the reference line RL may be about 30±5 degrees, and the angle $\theta_{Q1}$ of the optical axis Q1-OX of the first $\lambda/4$ phase retarder RP-Q1 with respect to the reference line RL may be about 150±5 degrees. However, an embodiment is not limited thereto. Furthermore, in the upper polarizing plate that may be the light control layer ARP-1a, the angle $\theta_{P2}$ of the absorption axis PP2-AX of the second linear polarizing layer PP-2 with respect to the reference line RL parallel to the first direction axis DR1 may be about 45±5 degrees, the angle $\theta_{H2}$ of the optical axis H2-OX of the second $\lambda/2$ phase retarder RP-H2 with respect to the reference line RL may be about 150±5 degrees, and the angle $\theta_{Q2}$ of the optical axis Q2-OX of the second $\lambda/4$ phase retarder RP-Q2 with respect to the reference line RL may be about 30±5 degrees. However, an embodiment is not limited thereto.

In an embodiment illustrated in FIG. 29, light provided to the light control layer ARP-1a and sequentially transmitted through the second linear polarizing layer PP-2, the second $\lambda/2$ phase retarder RP-H2, and the second $\lambda/4$ phase retarder RP-Q2 may be clockwise polarized light, and light provided after being sequentially transmitted through the first linear polarizing layer PP-1, the first $\lambda/2$ phase retarder RP-H1, and the first $\lambda/4$ phase retarder RP-Q1 of the lower polarizing plate PM-1a may also be clockwise polarized light.

Referring to FIGS. 28 and 29, in the electronic devices DD-3, DD-4 of an embodiment, in the case where the light control layer ARP-1 or ARP-1a may be provided as an upper polarizing plate, both the upper polarizing plate and the lower polarizing plate PM-1 or PM-1a may counterclockwise polarize provided light to transmit the light, or both the upper polarizing plate and the lower polarizing plate PM-1 or PM-1a may clockwise polarize provided light to transmit the light. Accordingly, in the electronic device of an embodiment, an external optical signal may be transmitted through a portion corresponding to the non-pixel unit AR2 (FIG. 17) and provided to the electronic module EM (FIG. 2), and an optical signal emitted from the electronic module EM (FIG. 2) may be transferred externally.

The lower polarizing plates PM-1 and PM-1a of the electronic devices DD-3 and DD-4 described above with reference to FIGS. 28 and 29 may have the structure of the first linear polarizing layer PP-1a according to an embodiment described above with reference to FIG. 8.

Figure 31:
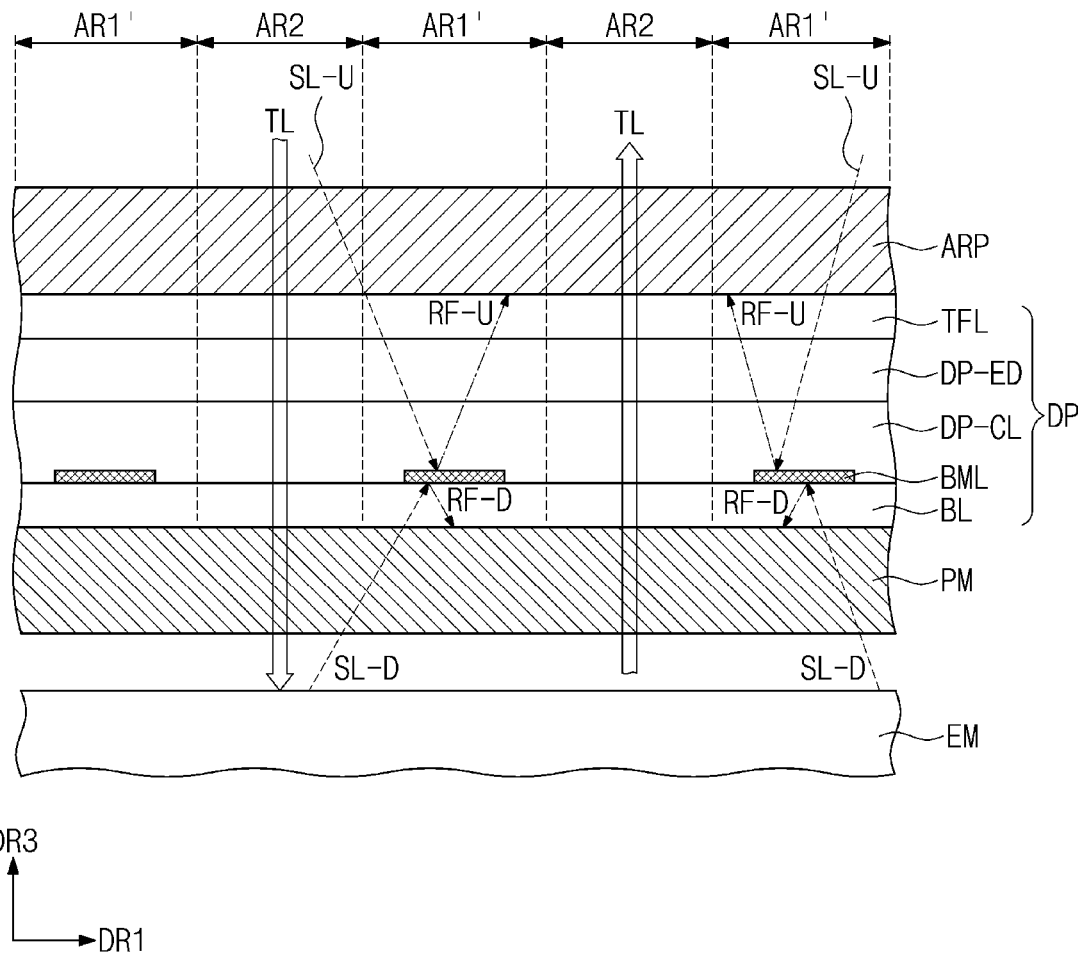
FIG. 31 is a schematic cross-sectional view of a portion of an electronic device according to an embodiment.

FIG. 31 is a diagram illustrating a light travel direction in an electronic device according to an embodiment. An electronic device according to an embodiment may include the electronic module EM, the display panel DP arranged or disposed on the electronic module EM, the lower polarizing plate PM arranged or disposed between the electronic module EM and the display panel DP, and the light control layer ARP arranged or disposed on the display panel DP.

Light which is incident towards the electronic module EM from above the light control layer ARP, for example, from the outside of the electronic device, or light which is transferred from the electronic module EM towards the light control layer ARP by being transmitted through the display panel DP is transferred as transmission light TL in a transmissive region that may be a portion of the non-pixel unit AR2 which does not overlap the shielding pattern BML. The transmission light TL is transmitted through the light control layer ARP and the lower polarizing plate PM without being reflected by metal patterns included in the circuit layer DP-CL or the light-emitting element layer DP-ED.

Upper side light SL-U, which is incident towards the shielding pattern BML and may be a portion of the light incident towards the electronic module EM from above the light control layer ARP, is reflected from the shielding pattern BML and incident onto the light control layer ARP as upper reflected light RF-U, and the light control layer ARP absorbs the upper reflected light RF-U or blocks transmission of the reflected light RF-U so that the upper reflected light RF-U is not viewed from the outside of the electronic device.

Furthermore, lower side light SL-D, which is incident towards the shielding pattern BML and may be a portion of the light incident from the electronic module EM to the display panel DP, is reflected from the shielding pattern BML and incident onto the lower polarizing plate PM as lower reflected light RF-D, and the lower polarizing plate PM blocks the incident lower reflected light RF-D from being transmitted and emitted to the outside so that the lower reflected light RF-D is not viewed from the outside of the electronic device.

Therefore, the electronic device of an embodiment, which may include a lower polarizing plate between a display panel and an electronic module and may include a light control layer on the display panel, may block reflected light from a metal pattern layer such as a shielding pattern included in the display panel, thereby providing excellent display quality. Furthermore, the electronic device of an embodiment may prevent a distorted image from being displayed or captured by blocking reflected light.

Figure 32:
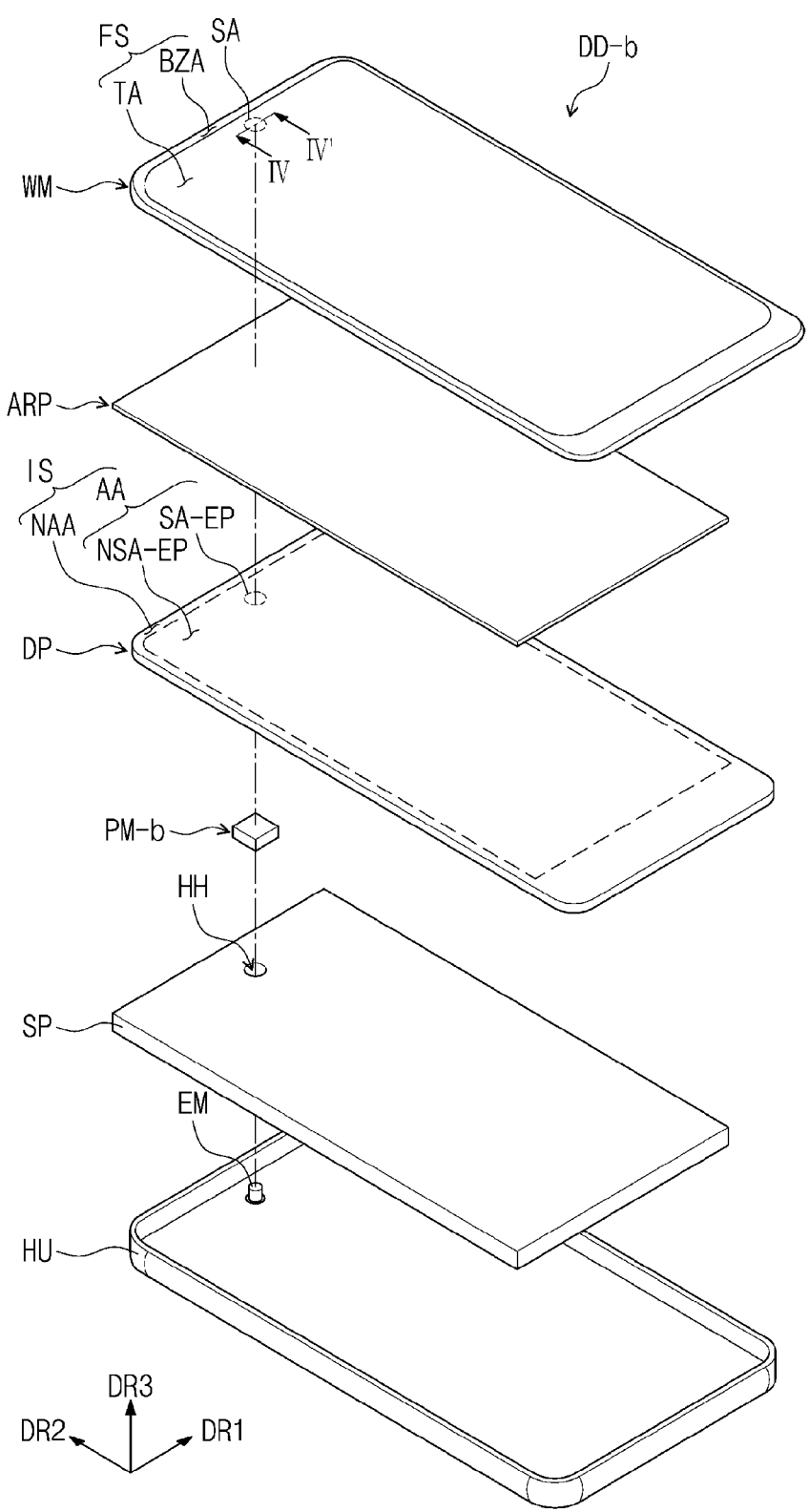
FIG. 32 is an exploded perspective view of an electronic device according to an embodiment.
Figure 33:
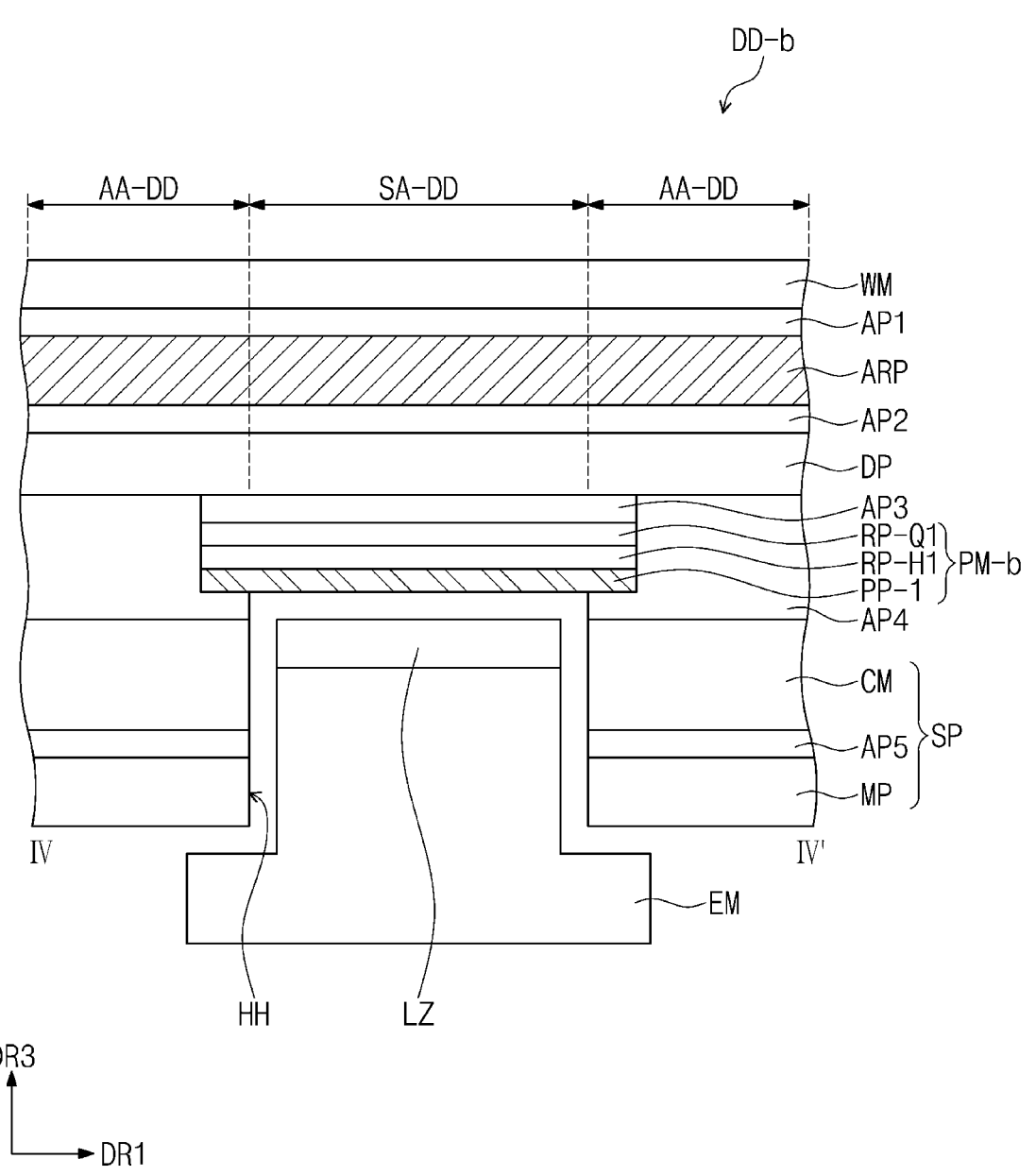
FIG. 33 is a schematic cross-sectional view of a portion of an electronic device corresponding to line IV-IV' of FIG. 32 of an embodiment.

FIG. 32 is an exploded perspective view of an electronic device of an embodiment. FIG. 33 is a schematic cross-sectional view of an electronic device of an embodiment. FIG. 33 is a schematic cross-sectional view illustrating a portion corresponding to line IV-IV' of FIG. 32.

Referring to FIGS. 32 and 33, in an electronic device DD-b of an embodiment, a lower polarizing plate PM-b may be arranged or disposed between the electronic module EM and the display panel DP. The lower polarizing plate PM-b may be arranged or disposed in an optical path of the electronic module EM.

In an embodiment, the lower polarizing plate PM-b may overlap the first display region SA-EP. The lower polarizing plate PM-b may overlap an entirety of the first display region SA-EP and may not overlap only a portion of the second display region NSA-EP. The lower polarizing plate PM-b may overlap the first display region SA-EP and a portion of the second display region NSA-EP adjacent to the first display region SA-EP. However, unlike the illustration, the lower polarizing plate PM-b may overlap only the first display region SA-EP and may not overlap the second display region NSA-EP in an embodiment. For example, in an embodiment, the lower polarizing plate PM-b may be provided in a form corresponding to the first display region SA-EP.

As illustrated in FIG. 33, the lower polarizing plate PM-b may be arranged or disposed in the sensing region SA-DD and a portion of the active region AA-DD adjacent to the sensing region SA-DD. In another portion of the active region AA-DD in which the lower polarizing plate PM-b may not be arranged or disposed, the adhesive layer AP4 may be arranged or disposed. The adhesive layer AP4 may fill the other portion in which the lower polarizing plate PM-a is not arranged or disposed between the support member SP and the display panel DP.

In the electronic device DD-a illustrated in FIGS. 32 and 33, the lower polarizing plate PM-b may be arranged or disposed so as to overall overlap an upper portion of the electronic module EM. For example, the lower polarizing plate PM-b may be arranged or disposed so as to overall overlap the lens LZ that may be an upper portion of the electronic module EM. In an embodiment illustrated in FIGS. 32 and 33, an area of the lower polarizing plate PM-b may be greater than an area of the lens LZ of the electronic module EM.

In the electronic device DD-a of an embodiment, the lower polarizing plate PM-b may be arranged or disposed so as to overall overlap an upper portion of the electronic module EM so that reflected light reflected from metal patterns included in the display panel DP and incident to the electronic module EM or light which is incident back to the electronic module EM after being emitted from the electronic module EM and reflected from the metal patterns included in the display panel DP may be blocked, thereby providing improved display quality and improved image capture quality.

The electronic device of an embodiment, which may include a lower polarizing plate between an electronic module and a display panel, may effectively block light reflected from metal patterns or the like included in the display panel, thereby providing improved display quality and improved performance of an electronic module.

An embodiment may provide an electronic device which suppresses deterioration of display quality caused by light reflected from metal patterns included in a display panel by arranging or disposing a lower polarizing plate between an electronic module and the display panel.

Furthermore, an embodiment may provide an electronic device which suppresses distortion of an image and deterioration of image capture quality that may occur due to light reflected from metal patterns included in a display panel by arranging or disposing a lower polarizing plate between an electronic module and the display panel.

Although embodiments have been described, it is understood that the disclosure should not be limited to these embodiments but various changes and modifications can be made by one of ordinary skill in the art within the spirit and scope of the disclosure as hereinafter claimed.

What is claimed is:
1. An electronic device comprising:
an electronic module;
a support member in which a through-hole overlapping the electronic module is defined;
a display panel disposed on the support member and comprising:
a first display region overlapping the through-hole of the support member; and
a second display region that does not overlap the through-hole of the support member, the second display region being adjacent to the first display region;
a light control layer disposed on the display panel; and
a lower polarizing plate disposed between the electronic module and the display panel,
wherein the lower polarizing plate comprises:
a first linear polarizing layer adjacent to the electronic module and comprising an upper surface, a lower surface opposite the upper surface, first non-polarizing portions, and first linear polarizing portions alternately arranged with each other and each overlapping the first display region, wherein the lower surface has a portion exposed to and overlapping the electronic module; and
a first phase retardation layer disposed between the first linear polarizing layer and the display panel and directly contacting the upper surface of the first linear polarizing layer,
wherein the first phase retardation layer comprises two phase retarders configured to provide respectively different amounts of phase shift,
wherein the lower polarizing plate comprises a first polarizing region disposed in the first display region and is absent from the second display region, and
wherein the first polarizing region comprises the first linear polarizing portions and the first non-polarizing portions.
2. The electronic device of claim 1, wherein the first phase retardation layer of the lower polarizing plate is a λ/4 phase retarder, and an angle between an absorption axis of the first linear polarizing layer of the lower polarizing plate and an optical axis of the first phase retardation layer of the lower polarizing plate is about 45±5 degrees.

3. The electronic device of claim 2, wherein the light control layer comprises an upper polarizing plate, the upper polarizing plate comprises:

a second linear polarizing layer; and a second phase retardation layer disposed between the display panel and the second linear polarizing layer, the second phase retardation layer of the upper polarizing plate is a λ/4 phase retarder, and an angle between an absorption axis of the second linear polarizing layer of the upper polarizing plate and an optical axis of the second phase retardation layer of the upper polarizing plate is about 45±5 degrees.

4. The electronic device of claim 1, wherein the first phase retardation layer of the lower polarizing plate comprises:

a first λ/4 phase retarder; and a first λ/2 phase retarder disposed between the first λ/4 phase retarder and the first linear polarizing layer of the lower polarizing plate, an angle between an absorption axis of the first linear polarizing layer of the lower polarizing plate and an optical axis of the first λ/4 phase retarder is about 15±5 degrees, and an angle between the absorption axis of the first linear polarizing layer of the lower polarizing plate and an optical axis of the first λ/2 phase retarder is about 75±5 degrees.

5. The electronic device of claim 4, wherein the light control layer comprises an upper polarizing plate, the upper polarizing plate comprises:

a second linear polarizing layer;

a second λ/4 phase retarder disposed between the display panel and the second linear polarizing layer, and a second λ/2 phase retarder disposed between the second λ/4 phase retarder and the second linear polarizing layer, an angle between an absorption axis of the second linear polarizing layer of the upper polarizing plate and an optical axis of the second λ/4 phase retarder of the upper polarizing plate is about 15±5 degrees, and an angle between the absorption axis of the second linear polarizing layer of the upper polarizing plate and an optical axis of the second λ/2 phase retarder of the upper polarizing plate is about 75±5 degrees.

6. The electronic device of claim 5, wherein a polarized component transmitted through the lower polarizing plate and a polarized component transmitted through the light control layer are both counterclockwise polarized light.

7. The electronic device of claim 5, wherein a polarized component transmitted through the lower polarizing plate and a polarized component transmitted through the light control layer are both clockwise polarized light.

8. The electronic device of claim 1, wherein the light control layer comprises:

a first filter portion that transmits blue light;

a second filter portion that transmits green light;

a third filter portion that transmits red light; and a light-shielding portion overlapping edges of the first filter portion, the second filter portion, and the third filter portion.

9. The electronic device of claim 1, wherein the lower polarizing plate overlaps the first display region of the display panel and a portion of the second display region of the display panel adjacent to the first display region of the display panel.

10. The electronic device of claim 9, further comprising an adhesive layer disposed between the support member and the display panel, wherein the adhesive layer fills a gap between the support member and the display panel by overlapping the second display region of the display panel that does not overlap the lower polarizing plate.

11. The electronic device of claim 1, wherein the electronic module comprises a lens adjacent to the lower polarizing plate, and an area of the lower polarizing plate is greater than an area of the lens of the electronic module in a plan view.

12. The electronic device of claim 1, wherein the lower polarizing plate further comprises:

a second polarizing region adjacent to the first polarizing region and overlapping the second display region, wherein the first non-polarizing portions having a higher light transmittance than a light transmittance of the first linear polarizing portions; and wherein the second polarizing region does not include the first non-polarizing portions.

13. The electronic device of claim 12, wherein the first linear polarizing layer of the lower polarizing plate comprises a stretched polymer film and light absorbers adsorbed into the stretched polymer film, and a number of light absorbers per unit area in the first non-polarizing portions of the lower polarizing plate is smaller than a number of light absorbers per unit area in the first linear polarizing portions of the lower polarizing plate.

14. The electronic device of claim 12, wherein the light control layer comprises an upper polarizing plate, and the upper polarizing plate comprises:

a third polarizing region overlapping the first polarizing region of the lower polarizing plate and comprising:

a second polarizing portion; and a second non-polarizing portion having a higher light transmittance than a light transmittance of the second polarizing portion; and a fourth polarizing region overlapping the second polarizing region of the lower polarizing plate.

15. The electronic device of claim 1, wherein the display panel comprises:

a base layer;

a circuit layer comprising a shielding pattern disposed on the base layer;

a light-emitting element layer disposed on the circuit layer; and an upper insulating layer disposed on the light-emitting element layer.

16. The electronic device of claim 15, wherein the first display region of the display panel comprises:

a non-pixel region not including the shielding pattern; and a pixel region including the shielding pattern, and a light transmittance of light transmitted through the light control layer and the lower polarizing plate overlapping the non-pixel region is higher than a light transmittance of light transmitted through the light control layer and the lower polarizing plate overlapping the pixel region.

17. The electronic device of claim 1, wherein the electronic module is a camera having an optical path in a direction to the display panel.

18. The electronic device of claim 1, wherein each of the first display region and the second display region of the display panel comprises a plurality of pixel units, and a number of pixel units per unit area of the plurality of pixel units in the second display region of the display panel is smaller than a number of pixel units per unit area of the plurality of pixel units in the first display region of the display panel.

19. An electronic device comprising:

an electronic module;

a display panel disposed on the electronic module and comprising:

a first display region overlapping the electronic module; and a second display region having a higher pixel density than a pixel density of the first display region;

an upper polarizing plate disposed on the display panel; and a lower polarizing plate disposed between the electronic module and the display panel and comprising a first linear polarizing layer and a first phase retardation layer, the first linear polarizing layer including an upper surface, a lower surface opposite the upper surface, first non-polarizing portions, and first linear polarizing portions alternately arranged with each other and each overlapping the first display region, wherein the lower surface has a portion exposed to and overlapping the electronic module, and the first phase retardation layer directly contacts the upper surface of the first linear polarizing layer between the first linear polarizing layer and the display panel, wherein the first linear polarizing layer is patterned in a configuration substantially corresponding to only the first display region; and wherein the upper polarizing plate and the lower polarizing plate circularly polarize incident light in a same direction to transmit the incident light.

20. The electronic device of claim 19, wherein the upper polarizing plate and the lower polarizing plate polarize light counterclockwise to transmit counterclockwise polarized light, or the upper polarizing plate and the lower polarizing plate polarize light clockwise to transmit clockwise polarized light.

21. The electronic device of claim 19, wherein the first phase retardation layer of the lower polarizing plate comprises:

a first $\lambda/4$ phase retarder disposed between the first linear polarizing layer and the display panel, and an angle between an absorption axis of the first linear polarizing layer and an optical axis of the first $\lambda/4$ phase retarder is about $45\pm5$ degrees.

22. The electronic device of claim 21, wherein the upper polarizing plate comprises:

a second linear polarizing layer; and a second $\lambda/4$ phase retarder disposed between the display panel and the second linear polarizing layer, and an angle between an absorption axis of the second linear polarizing layer and an optical axis of the second $\lambda/4$ phase retarder is about $45\pm5$ degrees.

23. The electronic device of claim 19, wherein the first phase retardation layer of the lower polarizing plate comprises:

a first $\lambda/4$ phase retarder disposed on the first linear polarizing layer; and a first $\lambda/2$ phase retarder disposed between the first $\lambda/4$ phase retarder and the first linear polarizing layer, an angle between an absorption axis of the first linear polarizing layer and an optical axis of the first $\lambda/4$ phase retarder is about $15\pm5$ degrees, and an angle between the absorption axis of the first linear polarizing layer and an optical axis of the first $\lambda/2$ phase retarder is about $75\pm5$ degrees.

24. The electronic device of claim 23, wherein the upper polarizing plate comprises:

a second linear polarizing layer;

a second $\lambda/4$ phase retarder disposed between the display panel and the second linear polarizing layer; and a second $\lambda/2$ phase retarder disposed between the second $\lambda/4$ phase retarder and the second linear polarizing layer, an angle between an absorption axis of the second linear polarizing layer and an optical axis of the second $\lambda/4$ phase retarder is about $15\pm5$ degrees, and an angle between the absorption axis of the second linear polarizing layer and an optical axis of the second $\lambda/2$ phase retarder is about $75\pm5$ degrees.

25. The electronic device of claim 19, wherein the electronic module comprises a lens adjacent to the lower polarizing plate, and an area of the lower polarizing plate is greater than an area of the lens of the electronic module in a plan view.

26. An electronic device comprising:

an electronic module;

a display panel disposed on the electronic module and comprising:

a first display region overlapping the electronic module; and a second display region surrounding at least a portion of the first display region;

a light control layer disposed on the display panel; and a lower polarizing plate disposed between the electronic module and the display panel, wherein the lower polarizing plate comprises:

a first linear polarizing layer adjacent to the electronic module and comprising:

an upper surface;

a lower surface opposite the upper surface and having a portion exposed to and overlapping the electronic module;

a plurality of linear polarizing portions; and a plurality of non-polarizing portions having a higher light transmittance than a light transmittance of the linear polarizing portions, the non-polarizing portions and the linear polarizing portions alternately arranged with each other and each overlapping the first display region; and a first phase retardation layer disposed between the first linear polarizing layer and the display panel and directly contacting the upper surface of the first linear polarizing layer, and wherein the first linear polarizing layer is patterned in a configuration substantially corresponding to only the first display region.

27. The electronic device of claim 26, wherein the first linear polarizing layer comprises a stretched polymer film and light absorbers adsorbed into the stretched polymer film, and one or more of the non-polarizing portions of the lower polarizing plate comprises the stretched polymer film in which the light absorbers are desorbed.

28. The electronic device of claim 26, wherein the lower polarizing plate comprises:

a first polarizing region comprising the non-polarizing portions and overlapping the first display region of the display panel; and a second polarizing region overlapping the second display region of the display panel and not including the non-polarizing portions of the first polarizing region of the lower polarizing plate.

29. The electronic device of claim 28, wherein the display panel comprises:

a base layer;

a circuit layer comprising a shielding pattern disposed on the base layer;

a light-emitting element layer disposed on the circuit layer; and an upper insulating layer disposed on the light-emitting element layer, wherein the shielding pattern and the non-polarizing portions of the first polarizing region of the lower polarizing plate do not overlap in the first display region of the display panel.

30. The electronic device of claim 26, wherein the first phase retardation layer is a $\lambda/4$ phase retarder, and an angle between an absorption axis of the first linear polarizing layer and an optical axis of the first phase retardation layer is about $45\pm5$ degrees.

31. The electronic device of claim 30, wherein the light control layer comprises an upper polarizing plate, the upper polarizing plate comprises:

a second linear polarizing layer; and a second phase retardation layer disposed between the display panel and the second linear polarizing layer, the second phase retardation layer is a $\lambda/4$ phase retarder, and an angle between an absorption axis of the second linear polarizing layer and an optical axis of the second phase retardation layer is about $45\pm5$ degrees.

32. The electronic device of claim 31, wherein the upper polarizing plate comprises:

a third polarizing region overlapping the first polarizing region of the lower polarizing plate and comprising:

a second polarizing portion; and a second non-polarizing portion having a higher light transmittance than a light transmittance of the second polarizing portion; and a fourth polarizing region overlapping the second polarizing region of the lower polarizing plate and not including the second non-polarizing portion.

\* \* \* \* \*